US010083830B2

(12) United States Patent
Seino et al.

(10) Patent No.: US 10,083,830 B2
(45) Date of Patent: Sep. 25, 2018

(54) SUBSTRATE CLEANING METHOD FOR REMOVING OXIDE FILM

(71) Applicant: CANON ANELVA CORPORATION, Kawasaki-shi (JP)

(72) Inventors: Takuya Seino, Kawasaki (JP); Manabu Ikemoto, Sagamihara (JP); Kimiko Mashimo, Tokyo (JP)

(73) Assignee: CANON ANELVA CORPORATION, Kawasaki-Shi (JP)

( * ) Notice: Subject to any disclaimer, the term of this patent is extended or adjusted under 35 U.S.C. 154(b) by 124 days.

(21) Appl. No.: 15/161,892

(22) Filed: May 23, 2016

(65) Prior Publication Data
US 2016/0343565 A1    Nov. 24, 2016

Related U.S. Application Data

(60) Division of application No. 12/765,922, filed on Apr. 23, 2010, now abandoned, which is a continuation of
(Continued)

(30) Foreign Application Priority Data

Nov. 2, 2007  (JP) .................... PCT/JP2007/071393

(51) Int. Cl.
H01L 21/02        (2006.01)
H01L 21/28        (2006.01)
(Continued)

(52) U.S. Cl.
CPC .... H01L 21/02049 (2013.01); H01J 37/3244 (2013.01); H01J 37/32091 (2013.01);
(Continued)

(58) Field of Classification Search
None
See application file for complete search history.

(56) References Cited

U.S. PATENT DOCUMENTS 5,336,326 A    8/1994  Kamer et al.
5,919,336 A *  7/1999  Kikuchi ............ H01J 37/32357
                                                134/1.1
(Continued)

FOREIGN PATENT DOCUMENTS

JP    4-96226 A    3/1992
JP    6-120181 A   4/1994
(Continued)

OTHER PUBLICATIONS

Office Action issued in Japanese Application No. 2008-242665 (dated Nov. 15, 2012) (4 pages).
(Continued)

Primary Examiner — Shamim Ahmed
(74) Attorney, Agent, or Firm — Fitzpatrick, Cella, Harper & Scinto

(57) ABSTRACT

It was found out that when radicals generated by plasma are fed to a treatment chamber via a plurality of holes (111) formed on a partition plate which separates a plasma-forming chamber (108) from the treatment chamber, and the radicals are mixed with a treatment gas which is separately fed to the treatment chamber, the excitation energy of the radicals is suppressed and thereby the substrate surface treatment at high Si-selectivity becomes possible, which makes it possible to conduct the surface treatment of removing native oxide film and organic matter without deteriorating the flatness of the substrate surface. The radicals in the plasma are fed to the treatment chamber via radical-passing holes (111) of a plasma-confinement electrode plate (110) for plasma separation, the treatment gas is fed to the treatment chamber (121) to be mixed with the radicals in the
(Continued)

treatment chamber, and then the substrate surface is cleaned by the mixed atmosphere of the radicals and the treatment gas.

18 Claims, 17 Drawing Sheets

Related U.S. Application Data application No. PCT/JP2008/067016, filed on Sep. 19, 2008.

(51) Int. Cl.
- *H01L 21/67* (2006.01)
- *H01J 37/32* (2006.01)
- *H01L 29/51* (2006.01)
- *H01L 29/49* (2006.01)
- *H01L 29/66* (2006.01)

(52) U.S. Cl.
CPC .... *H01L 21/0262* (2013.01); *H01L 21/02381* (2013.01); *H01L 21/02532* (2013.01); *H01L 21/28194* (2013.01); *H01L 21/28202* (2013.01); *H01L 21/67196* (2013.01); *H01L 29/517* (2013.01); H01L 21/02573 (2013.01); H01L 21/02658 (2013.01); *H01L 29/495* (2013.01); *H01L 29/4916* (2013.01); *H01L 29/4966* (2013.01); *H01L 29/4975* (2013.01); *H01L 29/66651* (2013.01)

(56) References Cited

U.S. PATENT DOCUMENTS

| | | | |
|---|---|---|---|
| 6,107,192 A | 8/2000 | Subrahmanya et al. | |
| 6,313,042 B1 | 11/2001 | Cohen et al. | |
| 6,663,715 B1 | 12/2003 | Yuda et al. | |
| 6,693,030 B1 | 2/2004 | Subrahmanyan et al. | |
| 6,713,401 B2 | 3/2004 | Yokogawa et al. | |
| 7,111,629 B2 | 9/2006 | Kim et al. | |
| 7,432,201 B2 * | 10/2008 | Takehara | C23C 14/568 257/E21.414 |
| 2001/0003014 A1 | 6/2001 | Yuda | |
| 2001/0042512 A1 | 11/2001 | Xu et al. | |
| 2002/0124867 A1 | 9/2002 | Kim et al. | |
| 2002/0129902 A1 | 9/2002 | Babayan et al. | |
| 2003/0203606 A1 * | 10/2003 | Maekawa | H01L 21/28518 438/592 |
| 2004/0194799 A1 | 10/2004 | Kim et al. | |
| 2005/0211171 A1 | 9/2005 | Hanawa et al. | |
| 2005/0221564 A1 * | 10/2005 | Bevan | H01L 21/28202 438/287 |
| 2006/0021701 A1 | 2/2006 | Tobe et al. | |
| 2006/0157079 A1 | 7/2006 | Kim et al. | |
| 2006/0223986 A1 | 10/2006 | Chiou et al. | |
| 2008/0038484 A1 | 2/2008 | Alcott et al. | |
| 2008/0044589 A1 | 2/2008 | Ichikawa et al. | |
| 2008/0305275 A1 | 12/2008 | Ichikawa et al. | |

FOREIGN PATENT DOCUMENTS

| | | |
|---|---|---|
| JP | 6-236850 A | 8/1994 |
| JP | 7-307332 A | 11/1995 |
| JP | 10-147877 A | 6/1998 |
| JP | 10-172957 A | 6/1998 |
| JP | 2001-77031 A | 3/2001 |
| JP | 2001-102311 A | 4/2001 |
| JP | 2001-135628 A | 5/2001 |
| JP | 2001-144028 A | 5/2001 |
| JP | 2001-164371 A | 6/2001 |
| JP | 2002-500276 A | 1/2002 |
| JP | 2002-217169 A | 8/2002 |
| JP | 2002-289596 A | 10/2002 |
| JP | 2004-63520 A | 2/2004 |
| JP | 2004-356587 A | 12/2004 |
| JP | 2005-64120 A | 3/2005 |
| JP | 2007-273752 A | 10/2007 |
| JP | 2008-72029 A | 3/2008 |
| JP | 2008-112750 A | 5/2008 |

OTHER PUBLICATIONS

Office Action issued in Japanese Application No. 2010-003843 (dated Oct. 3, 2011) (3 pages).

* cited by examiner

THE INVENTION

SURFACE    CROSS SECTION

Ra = 0.17 nm

PRIOR ART

AFTER DIL.HF TREATMENT
(WET CLEANING), Si/SiGe GROWTH

SURFACE    CROSS SECTION

Ra = 0.21 nm

EXAMPLE 2 OF THE INVENTION

AFTER 5 MIN OF TREATMENT,
Si/SiGe GROWTH

SUBSTRATE CLEANING METHOD FOR REMOVING OXIDE FILM

CROSS-REFERENCES TO RELATED APPLICATIONS

This application is a divisional of U.S. patent application Ser. No. 12/765,922, filed on Apr. 23, 2010, which is a continuation application of PCT International Application No. PCT/JP2008/067016, filed on Sep. 19, 2008, the entire contents of which are incorporated by reference herein. This application also claims the benefit of priority from PCT International Application No. PCT/JP2007/071393, filed Nov. 2, 2007, the entire contents of which are incorporated herein by reference.

BACKGROUND OF THE INVENTION

Field of the Invention

The present invention relates to an apparatus and a method of manufacturing semiconductor device, including the treatment of substrate surface, specifically the treatment of surface of group IV semiconductor.

Related Background Art

Conventionally semiconductor Si substrate is subjected to wet-cleaning. The wet-cleaning has, however, problems of failing to completely remove water-marks in dry state, failing to control etching of very thin oxide film, requiring large apparatus, and the like. Furthermore, when the semiconductor substrate is exposed to atmospheric air for a long time after the wet-cleaning, there arise problems of forming native oxide film on the surface thereof and adsorbing carbon atoms thereon to inhibit film-forming of Si single crystal, generating irregular profile of film, generating impurity level at the interface of gate insulation film, and the like.

Therefore, surface oxide film was removed by applying UHV vacuum heating to 750° C. or higher or by applying heating to 800° C. or higher in an $H_2$ atmosphere before film formation. However, as miniaturization of device progresses and dielectric insulation film/metal electrode is used, the device needs to be manufactured at lower temperatures. Thus the device manufacturing needs to be done at 650° C. or lower temperature. As a result, the wet-cleaning has its limits, and there arises a need of dry-cleaning method which conducts treatment of semiconductor substrate in a vacuum before film-forming. The reverse sputtering method using argon plasma is one example of the method (Japanese Patent Laid-Open No. 10-147877). The disclosed method, however, presumably cuts also the Si—Si bond on the surface of the semiconductor substrate. In that case, problems arise such that oxide film is immediately formed on the Si-absent portion, that contaminants likely adhere to the dangling bond of Si, and that the sputtered oxide and contaminants adhere again to the side wall of the substrate. These problems adversely affect the succeeding step, (such as inhibition of epitaxial growth and formation of highly resistant portion on the silicide interface). Furthermore, damages on the device are also the problem.

Japanese Patent Laid-Open No. 2001-144028 describes that, after removing the silicon oxide film 401 from the surface of the substrate 5 using a plasmatized $F_2$ gas, the hydrogen radicals are irradiated to remove the F component adhered to the surface of the substrate (see FIG. 9A). Japanese Patent Laid-Open No. 04-96226 describes that, after removing the Si native oxide film 401 from the surface of the substrate 5 using $F_2$ gas, the radicalized hydrogen is irradiated to the substrate to terminate the bonding operation by the hydrogen (see FIG. 9A). Japanese Patent Laid-Open No. 06-120181 discloses a technology of terminating the bonding operation by hydrogen on the surface of the substrate 5 using hydrogen ions after removing the oxide film 401 on the substrate surface by HF plasma (see FIG. 9A). Since, however, the plasmatized $F_2$ gas contains not only the radicalized fluorine gas but also the ionized fluorine gas. There arises a problem of generating irregular surface on removing the silicon oxide film from the substrate surface. Furthermore, there is a possibility of removing a portion of the substrate itself not only removing the silicon oxide film thereon. In addition, since the semiconductor substrate is exposed to plasma, Si—Si bond is also cut off. In that case, there arise problems that the oxide film is immediately formed on the Si-absent portion, that the contaminants likely adhere to the dangling bond of Si, and that the sputtered oxide and contaminants adhere again to the side wall of the substrate. These problems adversely affect the succeeding stage, (such as inhibition of epitaxial growth and formation of highly resistant portion on the silicide interface). Furthermore, damages on device are also the problem. According to the disclosure, gas is decomposed positively by plasma to generate hydrogen radicals and hydrogen ions. When fluorine residue on the surface of the substrate is removed by the hydrogen radicals and the hydrogen ions, there arise problems of contamination by metal coming from the chamber, of excess etching because of large etching rate on the base Si, and the like. Furthermore, since HF as the reaction product likely adheres again to the surface of the substrate, sufficient F-removal effect is not attained.

Japanese Patent Laid-Open No. 2001-102311 describes that a cleaning gas such as fluorine is supplied to the plasma-forming part having the plasma-forming chamber which is separated, by a plate having feed holes therethrough, from the film-forming chamber where the substrate is placed, thus generating radicals by generating plasma in the plasma-forming part, and the fluorine radicals are fed to the film-forming space containing the substrate via the feed holes, thereby irradiating the radicals to the substrate for cleaning thereof. Japanese Patent Laid-Open No. 2002-500276 discloses a substrate cleaning method using a plate distributing the gas excited by a remote plasma source, through which plate the radicals are supplied to clean the substrate. Since, however, the surface of the semiconductor substrate cannot be exposed to an atmosphere which suppresses the excitation energy of radicals, etching with high Si selectivity cannot be conducted, which then raises a problem of failing to remove the native oxide film without deteriorating the surface roughness.

Japanese Patent Laid-Open No. 2002-217169 discloses an apparatus for conducting entire cleaning step in a vacuum to remove foreign matter applying simultaneously a physical action of friction stress generated by a high velocity gas flow. According to the disclosure, adsorption of impurities and generation of native oxide during vacuum transfer are suppressed, thus improving the production efficiency. Even if the foreign matter can be removed, however, the native oxide film and the surface roughness remain on the surface at an order of atomic layer thickness. That is, to attain the effect of device characteristic improvement by the continuous transfer in vacuum, there are required the cleaning technology to control the highly selective etching of Si and native oxide film at an order of atomic layer thickness, and the transfer of substrate and the film-forming thereon without exposing the substrate to atmospheric air. That kind of control technology and vacuum operation should provide good device characteristics of low interface state at the joint between semiconductor and dielectric insulation film, and of small fixed charge in the film.

Japanese Patent Laid-Open No. 10-172957 describes that the oxide film was able to be selectively removed by a mixed gas of: argon, helium, xenon, and hydrogen which are excited by a remote plasma source; and HF gas fed in downstream side, and that no damage was observed on the silicon substrate. The removal, however, did not satisfy the flatness required in recent years.

[Patent Document 1] Japanese Patent Laid-Open No. 2001-144028

[Patent Document 2] Japanese Patent Laid-Open No. 04-96226 (1992)

[Patent Document 3] Japanese Patent Laid-Open No. 06-120181 (1994)

[Patent Document 4] Japanese Patent Laid-Open No. 2001-102311

[Patent Document 5] Japanese Patent Application Publication No. 2002-500276

SUMMARY OF INVENTION

Problems to be Solved by the Invention

According to the conventional wet-cleaning surface treatment to remove native oxide film and organic matter from the substrate surface, there is a problem of deteriorating the device characteristics owing to the adsorption of air components to the substrate surface to leave native oxide film and impurities such as carbon atoms on the interface because the substrate after cleaned is transferred to the succeeding film-forming step in atmospheric air. When the substrate after treated by dry-cleaning on the surface thereof is subjected to the treatment in a vacuum not to leave the native oxide film and the impurities such as carbon atoms on the interface, the flatness of the substrate surface is deteriorated caused by the dry-cleaning, though the native oxide film and the impurities such as organic matter and carbon on the substrate surface can be removed. Furthermore, poor flatness of the substrate surface raises a problem of deteriorating the characteristics of manufactured device.

Means to Solve the Problems

The present invention is made to solve the above problems. According to the investigations of the inventors of the present invention, radicals generated by plasma are fed to the treatment chamber via a plurality of holes formed on a partition plate which separates the plasma-forming chamber from the treatment chamber, the radicals are mixed with a treatment gas which is separately fed to the treatment chamber, thus suppressing the excitation energy of the radicals to thereby enable the substrate surface treatment at high Si-selectivity, and thus it is found out that the surface treatment becomes available which removes native oxide film and organic matter without deteriorating the flatness of the substrate surface.

The present invention provides a method of cleaning a substrate comprising the steps of: placing a substrate in a treatment chamber; turning a plasma-forming gas; feeding a radical in the plasma to the treatment chamber via a radical-passing hole of a plasma-confinement electrode plate for plasma separation; feeding a treatment gas to the treatment chamber to mix it with the radical in the treatment chamber; and cleaning the surface of the substrate by the mixed atmosphere of the radical and the treatment gas.

The present invention provides a method of cleaning a substrate, wherein the surface 401 of the substrate 5 is a group IV semiconductor material, and the plasma-forming gas 402 and the treatment gas contain HF, respectively. See FIG. 9B.

The HF fraction in the plasma-forming gas to the total gas flow rate of the plasma-forming gas is preferably in a range from 0.2 to 1.0, and more preferably from 0.5 to 1.0. The HF fraction in the treatment gas to the total gas flow rate of the treatment gas is preferably in a range from 0.2 to 1.0, and more preferably from 0.75 to 1.0.

The present invention provides a method of cleaning a substrate, wherein the plasma-confinement electrode plate for plasma separation has a plurality of radical feed holes for feeding the radical in the plasma to the treatment chamber and a plurality of treatment gas feed holes for feeding the treatment gas into the treatment chamber, and thus the radical and the treatment gas are discharged toward the surface of the substrate in the treatment chamber via the respective feed holes.

The present invention provides a method of manufacturing a semiconductor device comprising the steps of: cleaning the surface of a group IV semiconductor substrate in a cleaning chamber in accordance with the above method; transferring the cleaned substrate from the cleaning chamber to an epitaxial chamber via a transfer chamber without exposing the substrate to atmospheric air; and epitaxially growing an epitaxial single crystal layer on the surface of the substrate in the epitaxial chamber.

The present invention provides a method of manufacturing a semiconductor device comprising the steps of: transferring a substrate having an epitaxial layer manufactured in accordance with the above method from the epitaxial chamber to a sputtering chamber via a transfer chamber without exposing the substrate to atmospheric air; sputtering a dielectric film onto the epitaxial layer in the sputtering chamber; transferring the substrate having the dielectric film thereon from the sputtering chamber to an oxidation-nitrification chamber via a transfer chamber without exposing the substrate to atmospheric air; and conducting oxidation, nitrification, or oxynitrification of the dielectric film in the oxidation-nitrification chamber.

The present invention provides a method of manufacturing a semiconductor device according to above method, wherein the dielectric film is made of the one selected from the group consisting of Hf, La, Ta, Al, W, Ti, Si, and Ge, or an alloy thereof.

The present invention provides a method of cleaning a substrate according to above method, wherein turning the plasma-forming gas into plasma is done by applying a high frequency power thereto, and the density of the high frequency power is in a range from 0.001 to 0.25 W/cm$^2$, preferably from 0.001 to 0.125 W/cm$^2$, and more preferably from 0.001 to 0.025 W/cm$^2$.

The present invention provides a substrate treatment apparatus of plasma-separation type generating a radical by forming plasma from a plasma-forming gas in a vacuum chamber, and conducting substrate treatment by the radical and a treatment gas, the substrate treatment apparatus comprising: a plasma-forming chamber for turning the plasma-forming gas fed therein into plasma; a treatment chamber containing a substrate holder on which a substrate to be treated is placed; and a plasma-confinement electrode plate for plasma separation having a plurality of radical-passing holes formed between the plasma-forming chamber and the treatment chamber, the plasma-confinement electrode plate of a hollow structure having a plurality of treatment gas feed holes opened toward the treatment chamber formed, and having a gas-feed pipe for supplying the treatment gas disposed, wherein: a plasma-forming space inside the plasma-forming chamber contains a high-frequency applying electrode for generating plasma by a power supplied from a high-frequency power source; the high-frequency applying electrode has a plurality of through-holes penetrating therethrough; the high-frequency applying electrode further contains a plasma-forming gas feed shower plate for feeding the plasma-forming gas to the plasma-forming chamber; and the plasma-forming gas feed shower plate has a plurality of gas-discharge ports for feeding the plasma-forming gas onto the electrode extending along the plasma-confinement electrode plate for plasma separation provided with the plurality of radical-passing holes.

The present invention provides a substrate treating apparatus, wherein the diameter of the plurality of gas holes opened on the plasma-forming gas feed shower plate is 2 mm or smaller, and preferably 1.5 mm or smaller.

The present invention provides a substrate treating apparatus, wherein in the above substrate treating apparatus, the volume ratio V2/V1 is in a range from 0.01 to 0.8, where V2 is the total volume of a plurality of through-holes of the electrode, and V1 is the total volume of the electrode including the through-holes.

The present invention provides a substrate treating apparatus according to above apparatus, wherein the density of the high frequency power applied to the high-frequency applying electrode is in a range from 0.001 to 0.25 W/cm$^2$, preferably from 0.001 to 0.125 W/cm$^2$, and more preferably from 0.001 to 0.025 W/cm$^2$.

The present invention provides a substrate treating apparatus according to above apparatus, wherein the plasma-forming gas fed to the plasma-forming chamber is a gas containing HF, and the gas fed to the treatment chamber is a gas containing HF.

The present invention provides an apparatus of manufacturing semiconductor device comprising: a substrate cleaning chamber including the above substrate treatment apparatus; an epitaxial growth chamber forming an epitaxial layer on the substrate; and a transfer chamber transferring the substrate coming from the substrate cleaning chamber to the epitaxial growth chamber without exposing the substrate to atmospheric air.

The present invention provides an apparatus of manufacturing a semiconductor device according to above apparatus, further comprising a sputtering chamber forming a dielectric film, thus allowing transferring the substrate coming from the cleaning chamber or the epitaxial growth chamber to the sputtering chamber via the transfer chamber without exposing the substrate to atmospheric air.

The present invention provides an apparatus of manufacturing a semiconductor device according to above apparatus, further comprising an oxidation-nitrification chamber for oxidation, nitrification, or oxynitrification of the dielectric film, thus allowing transferring the substrate coming from the cleaning chamber, the epitaxial growth chamber, or the sputtering chamber to the oxidation-nitrification chamber via the transfer chamber without exposing the substrate to atmospheric air.

Effect of the Invention

The present invention performs substrate treatment which can decrease the native oxide film and organic impurities on the surface of semiconductor substrate compared with the wet-cleaning in the related art, and can remove the native oxide film and organic matter without deteriorating the flatness of the substrate surface.

According to the present invention, to remove the native oxide film and contamination of organic impurities from the surface of semiconductor substrate, HF gas or a mixed gas containing at least HF is used as the plasma-forming gas and the treatment gas, and radicals are fed from the plasma-forming chamber to the treatment chamber, while feeding simultaneously gas molecules containing HF as the structural element thereto, thus exposing the surface of semiconductor substrate to the above atmosphere which suppresses the excitation energy of the radicals, to thereby remove the native oxide film and organic matter without deteriorating the flatness of the substrate surface. There generates no metal contamination and plasma damage on the semiconductor substrate. Although the wet-cleaning in the related art needs more than one step for the substrate treatment applying also succeeding steps such as annealing treatment, the present invention performs the substrate treatment in only one step, which attains desired effect efficiently, reduces cost, and significantly improves the treatment speed. Furthermore, use of a shower plate to the plasma-forming gas allows uniform feeding of the product gas, use of through-holes on the electrode part allows discharge even at a low power, and use of a plasma-confinement electrode plate for plasma separation provided with a plurality of radical-passing holes allows radicals in the produced plasma to be fed uniformly to the treatment chamber. By using HF as the plasma-forming gas, feeding the radicals from the plasma-forming chamber to the treatment chamber, and simultaneously feeding HF to the treatment chamber, the surface treatment provided fine surface roughness at an order of atomic layer thickness, which then realized to form a single crystal Si and SiGe film on the surface.

By the first step of conducting substrate surface treatment, and the second step of transferring the substrate without exposing the single crystal film to atmospheric air, the amount of impurities at the interface is smaller than that appears in the atmospheric transfer, and thus good device characteristics are attained.

By conducting the first step of conducting substrate surface treatment, the second step of forming single crystal film, the third step of sputtering the dielectric material to form a film, the fourth step of conducting oxidation, nitrification, or oxynitrification, and the fifth step of transferring the metallic material and the sputtered film in a vacuum without exposing thereof to atmospheric air, the amount of impurities on the joint interface between the semiconductor and the insulation film becomes smaller than that in atmospheric transfer, which provides the interface state density and the fixed charge density in film equivalent to those of oxide film attained in the related art, gives a C-V curve with small hysteresis, gives a small leak current, and thereby attains good device characteristics.

BRIEF DESCRIPTION OF THE DRAWINGS

FIG. 10B is a continuation of the flowchart of FIG. 10A.

EXAMPLES

Figure 1:
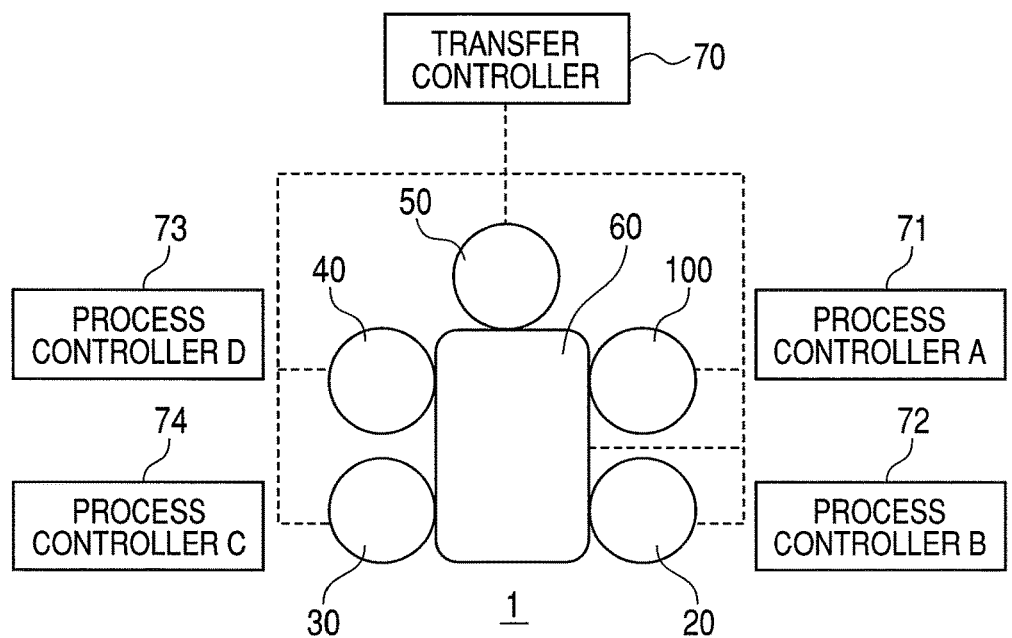
FIG. 1 is a schematic diagram of a configuration example of a film-forming apparatus used in the present invention.

Examples of the present invention will be described below.

Embodiments of the present invention will be described below referring to the drawings.

The examples deal with the cases of applying the present invention to a film-forming apparatus 1 illustrated in FIG. 1, focusing on a process of removing a native oxide film and organic matter formed on a Si substrate by the first step using a surface treatment apparatus 100 illustrated in FIGS. 3A to 3D.

A substrate 5 adopted as the sample is a Si single crystal substrate (with 300 mm in diameter) which is allowed to stand in a clean air to form a native oxide film thereon. The substrate 5 is transferred to a load-lock chamber 50 by a substrate-transfer mechanism (not shown), and is placed therein. Then, the load-lock chamber 50 is evacuated by an evacuation system (not shown). After evacuating to a desired pressure, or 1 Pa or below, a gate valve (not shown) between the load-lock chamber and a transfer chamber is opened, and a transfer mechanism (not shown) in the transfer chamber transfers the substrate 5 to the surface treatment apparatus 100 via a transfer chamber 60, and places the substrate 5 on a substrate holder 114.

<Description of the Surface Treatment Apparatus>

Figure 3A:
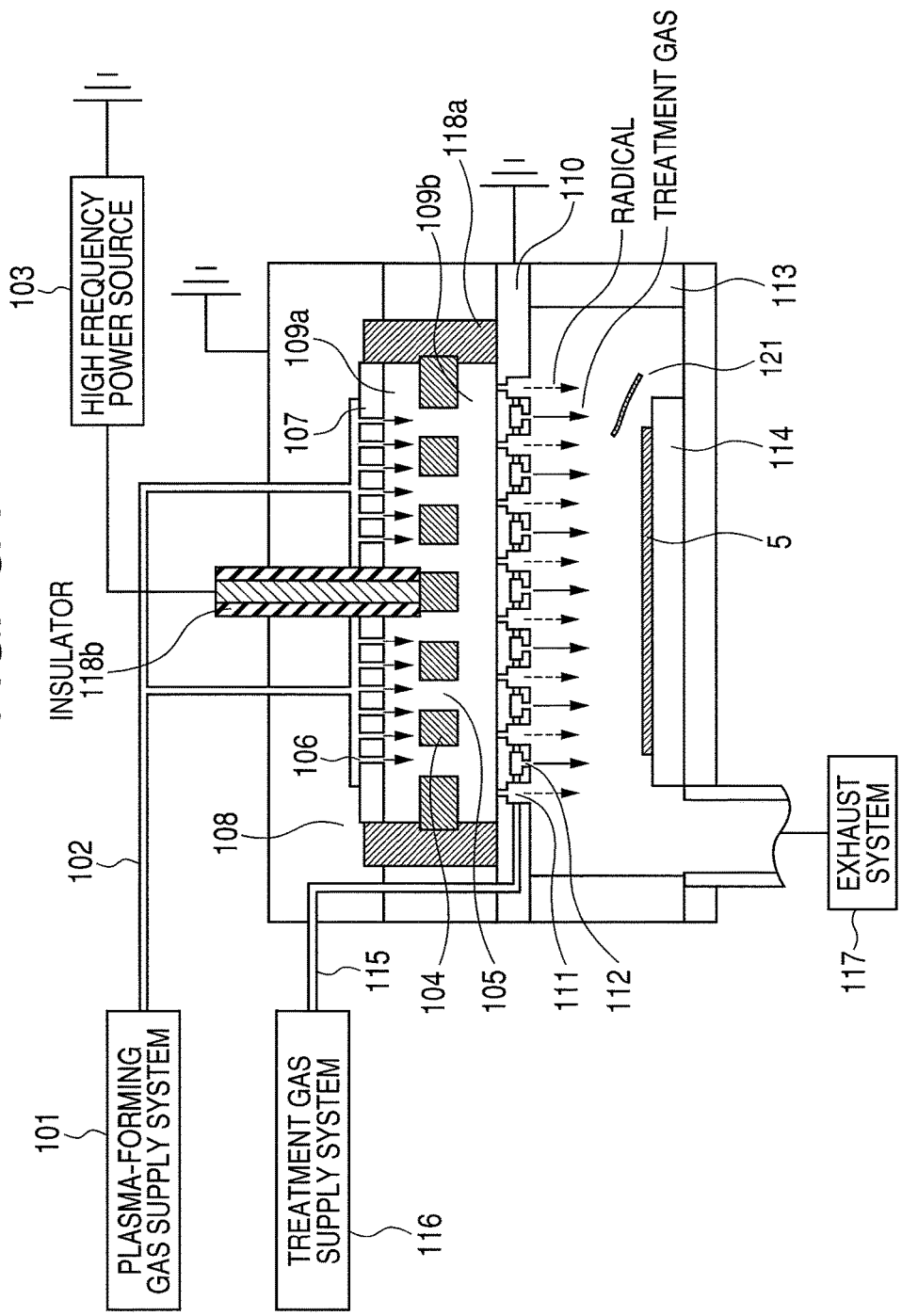
FIG. 3A is a schematic diagram of a configuration example of a surface treatment apparatus used in the present invention.

FIG. 3A illustrates the surface treatment apparatus 100 of the present invention.

The surface treatment apparatus 100 includes a treatment chamber 113 equipped with the substrate holder 114 on which the substrate 5 can be placed, and a plasma-forming chamber 108. The treatment chamber 113 and the plasma-forming chamber 108 are partitioned and separated from each other by a plasma-confinement electrode plate 110 for plasma separation having a plurality of radical-passing holes 111 therein. The plasma-confinement electrode plate 110 is made of a conductive material and is grounded. The plasma-forming chamber 108 has a plasma-forming gas feed shower plate 107 therein. A high-frequency applying electrode 104 in a plate-shape is located between the plasma-forming gas feed shower plate 107 and the plasma-confinement electrode plate 110. The high-frequency applying electrode 104 has a plurality of electrode through-holes 105 penetrating from the front face to the rear face thereof to uniformly stabilize the discharge. The high-frequency applying electrode 104 is connected to a high frequency power source 103 and can supply high frequency power. The high-frequency applying electrode 104 is supported by an insulator 118a and is fixed to the wall of the plasma-forming chamber as a plate-shape member extending in a lateral direction of the chamber in almost parallel with the plasma-confinement electrode 110. On both sides of the high-frequency applying electrode 104, there are upper and lower plasma-forming spaces 109a and 109b, respectively.

The upper plasma-forming space 109a contacts with the high-frequency applying electrode 104 and the plasma-forming gas shower plate 107. The lower plasma-forming space 109b contacts with the high-frequency applying electrode 104 and the plasma-confinement electrode plate 110.

Figure 3B:
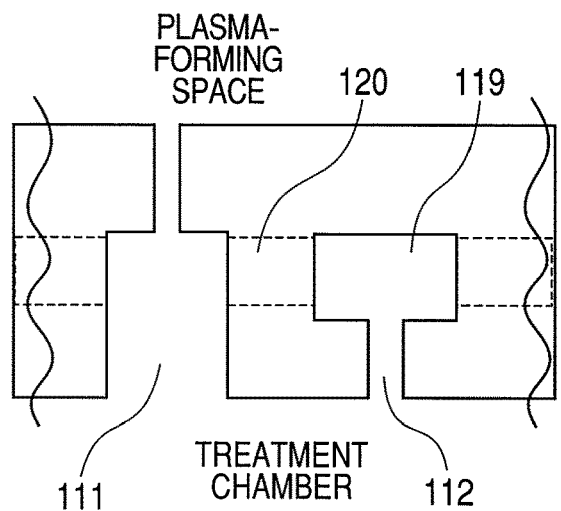
FIG. 3B is an enlarged cross section diagram of a plasma-confinement electrode plate in the surface treatment apparatus of the present invention.
Figure 3C:
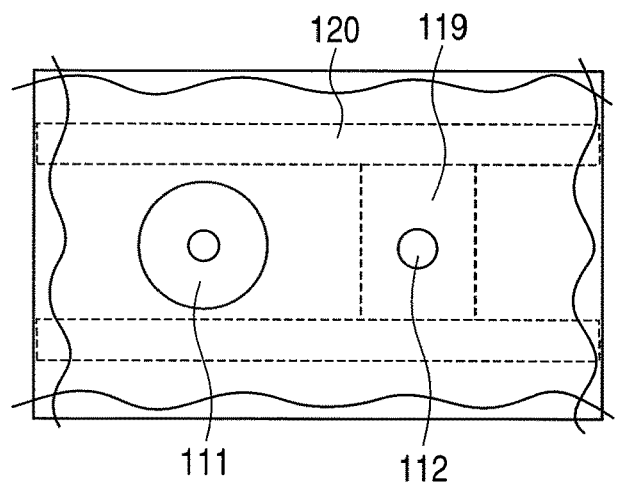
FIG. 3C is an enlarged view of the plasma-confinement electrode plate in the surface treatment apparatus of the present invention viewed from the treatment chamber side.

FIG. 3B illustrates an enlarged cross section of the plasma-confinement electrode plate 110. FIG. 3C illustrates an enlarged view of the plasma-confinement electrode plate 110 viewed from the treatment chamber. As shown in these Figures, the plasma-confinement electrode plate 110 faces the substrate-supporting face of the substrate holder 114, and has the radical feed holes 111 penetrating from the plasma-forming space 109 to a substrate cleaning treatment chamber 121. The plurality of radical feed holes 111 are distributedly formed on the face of the electrode plate 110.

The plasma-confinement electrode plate 110 has a treatment gas feed passage 120 to feed the treatment gas to the substrate cleaning treatment chamber 121, treatment gas feed spaces 119, and gas feed holes 112. The plurality of treatment gas feed holes 112 opened on the plasma-confinement electrode plate 110 toward the substrate cleaning treatment chamber 121 from the treatment gas feed space 119 communicated with the treatment gas feed passage 120 of the plasma-confinement electrode 110 are formed apposing to at least a part of the plurality of radical feed holes 111 on the face of the plasma-confinement electrode 110. The plasma-confinement electrode plate 110 has a hollow structure of the treatment gas feed passage 120 crossing laterally the electrode plate 110, (in the direction of partitioning the plasma-forming chamber 108 from the treatment chamber 113), and the treatment gas feed space 119 through which the treatment gas is injected from the passage 120. By feeding the treatment gas to the treatment gas feed passage 120, the treatment gas is uniformly supplied to the substrate 5 in the substrate cleaning treatment chamber 121 via the plurality of treatment gas feed spaces 119 and via the plurality of treatment gas feed holes 112.

These treatment gas feed passage 120, treatment gas feed space 119, and treatment gas feed hole 112 are not directly connected with the plasma-forming space 109 and the radical feed hole 111. Accordingly, the radicals fed from the radical feed holes 111 to the treatment space and the treatment gas fed from the treatment gas feed holes 112 are fed from the plasma-confinement electrode face toward the substrate face in the substrate cleaning treatment chamber 121 in almost parallel flows with each other. Then, the radicals and the treatment gas are mixed together in the substrate cleaning treatment chamber 121 for the first time.

The plasma-forming gas passes through a plasma-forming gas supply system 101 and a plasma-forming gas supply pipe 102, and enters the plasma-forming space 109a, the electrode through-holes 105, and the plasma-forming space 109b in the plasma-forming chamber 108, via plasma-forming gas feed holes 106 opened on the plasma-forming gas feed shower plate 107, and is raised to a specified pressure.

Once the power is supplied from the high frequency power source 103 to the high-frequency applying electrode 104, discharge begins in the upper and lower plasma-forming spaces 109a and 109b. The plasma-confinement electrode 110 functions as the ground electrode. Since the plasma-forming gas shower plate 107 also functions as the ground electrode because the chamber wall of the plasma-forming chamber 108 to which the plasma-forming gas shower plate 107 is connected is grounded. Grounding the plasma-confinement electrode plate 110 assures stable discharge. Also grounding the plasma-forming gas shower plate 107 assures stable discharge.

The shower plate may be an insulation material. In that case, the chamber wall positioned at a rear side thereof functions as the ground electrode. The plasma-confinement electrode plate 110 partitions the plasma-forming chamber 108 from the substrate cleaning treatment chamber 121. The substrate 5 being cleaned in the cleaning treatment chamber is placed facing the plasma-confinement electrode plate face. The radicals generated in the plasma in the plasma-forming spaces 109a and 109b are fed to the substrate cleaning treatment chamber 121 via the plurality of radical feed holes 111 formed on the plasma-confinement electrode plate 110 and communicating the plasma-forming chamber with the substrate cleaning treatment chamber. The electrically neutral radicals are allowed to pass through the radical feed holes to enter the substrate cleaning treatment chamber 121. However, very few of charged particles such as ions are allowed to pass through the radical feed holes 111 formed on the plasma-confinement electrode plate 110. The radical feed holes 111 of the plasma-confinement electrode plate 110 confines the plasma, and allows the electrically neutral radicals to pass therethrough. By grounding the plasma-confinement electrode plate 110, the performance of confining the plasma and the performance of allowing the electrically neutral radicals to pass therethrough are further improved. In addition, grounding the plasma-confinement electrode plate 110 provides shielding not to leak high frequency to the substrate cleaning treatment chamber 121. If the plasma-confinement electrode plate 110 is not grounded, the high frequency applied to the high-frequency applying electrode 104 is not shielded by the plasma-confinement electrode plate 110, and the plasma-confinement electrode plate 110 acts as the electrode, which may induce discharge also in the substrate cleaning treatment chamber 121 in the treatment chamber. Grounding the plasma-confinement electrode plate 110 can prevent the plasma invasion to and plasma generation in the substrate cleaning treatment chamber 121 in the treatment chamber.

The unexcited treatment gas for suppressing the excitation energy of the fed radicals is fed from a treatment gas supply system 116 to the treatment gas feed passage 120 via a treatment gas supply pipe 115 to diffuse therein, and then is fed to the treatment gas feed space 119, and further is fed to the substrate cleaning treatment chamber 121 via the treatment gas feed holes 112.

The radicals fed from the radical feed holes 111 to the treatment space and the treatment gas fed from the treatment gas feed holes 112 are mixed together in the substrate cleaning treatment chamber 121 for the first time, to conduct specified treatment on the substrate 5 placed facing the substrate cleaning treatment chamber 121.

After that, the gas in the substrate cleaning treatment chamber 121 is discharged by an exhaust system 117.

The shape of the radical feed hole 111 is not limited to the one illustrated in the drawings if only the hole has a function to allow the electrically neutral radicals to pass therethrough and to reject the plasma from passing therethrough. For example, in FIG. 3B and FIG. 3C, the shape of the radical feed hole 111 has a larger diameter at the side facing the substrate cleaning treatment chamber 121 than the diameter at the side facing the plasma-forming space 109. The diameter, however, may be the same at both sides. Alternatively, the diameter thereof may be smaller at the side facing the substrate cleaning treatment chamber 121 than the diameter facing the plasma-forming space 109. In FIG. 3B and FIG. 3C, the shape of the radical feed hole 111 has a spot-facing at the side of the substrate cleaning treatment chamber 121, with a narrow hole extended from the bottom of the spot-facing and opened toward the plasma-forming space. The number of narrow hole, however, may be more than one. Furthermore, the spot-facing may be opened at the side of the plasma space, and a narrow hole may penetrate from the bottom of the spot-facing toward the treatment chamber, or the number of narrow hole may be more than one.

Figure 3D:
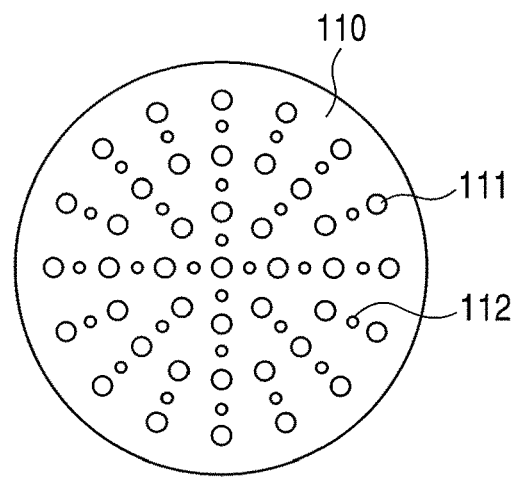
FIG. 3D is a schematic diagram of the plasma-confinement electrode plate part of the present invention viewed from the treatment chamber side.

FIG. 3D is a schematic diagram illustrating the plasma-confinement electrode plate 110 viewed from the treatment chamber side.

The radical feed holes 111 and the treatment gas feed holes 112 are distributed and opened over the entire face of the plasma-confinement electrode plate 110. Uniform distribution in the radius direction assures uniform supply of the radicals generated in the plasma-forming chamber toward the substrate, and assures uniform supply of the treatment gas separately fed simultaneously toward the substrate. Compared with the case that the treatment gas is fed through a single supply pipe from, for example, a side wall of the substrate cleaning treatment chamber 121, the structure of the present invention of supplying the treatment gas from the face of the plasma-confinement electrode plate in parallel with the radical feeding is further effective in terms of not only the uniformity over entire surface of the substrate for cleaning treatment but also the selective etching of native oxide film to Si by suppressing excitation energy of the radicals.

The distribution of the radical feed holes 111 and the treatment gas feed holes 112 is not limited to that given above, and the distribution can be varied under a requirement of perfect uniformization of the intraplane distribution for the substrate treatment, such as to respond to the fluctuations in gas concentration ratio induced by the reaction of substrate treatment in the substrate cleaning treatment chamber 121. For instance, the distribution density of radical feed holes 111 may be increased at peripheral area compared with that in central area, or decreased in peripheral area compared with that in central area. Similarly, the distribution density of treatment gas feed holes 112 may be increased at peripheral area compared with that in central area, or decreased in peripheral area compared with that in central area. In those cases, the decrease or the increase in the distribution density of radical feed holes 111 from the central area to the peripheral area may be linear or exponential.

The plasma-forming gas passes through the plasma-forming gas supply system 101 and the plasma-forming gas supply pipe 102, and enters the plasma-forming space 109 in the plasma-forming chamber 108 via the plasma-forming gas feed holes 106 formed on the plasma-forming gas feed shower plate 107. By the structure, uniform feed of the plasma-forming gas to the plasma-forming space 109 in the plasma-forming chamber 108 is enabled.

As described above, the radicals generated from the plasma-forming gas are fed to the treatment chamber 113 via the radical feed holes 111 formed on the plasma-confinement electrode plate 110 which partitions the treatment chamber 113 from the plasma-forming chamber 108. Only the electrically neutral molecules or atoms such as radicals are allowed to pass through the radical feed holes 111 formed on the plasma-confinement electrode plate 110 to enter the treatment chamber 113 from the plasma-forming chamber 108, and very few ions in the plasma are allowed to pass therethrough to enter the treatment chamber 113. In the plasma-forming chamber 108, when the ion density is about $1 \times 10^{10}$ count/cm$^3$, the ion density in the treatment chamber 113, calculated from the observed current level, is about $5 \times 10^2$ count/cm$^3$. The value shows that the ion density is decreased to one to ten million or less, which means actually very few ions are allowed to enter the treatment chamber 113. To the contrary, the radicals are transferred to the treatment chamber 113 by about several percentages to about several tens of percentages, depending on the life, of the total quantity of radicals generated in the plasma-forming chamber.

For the charged particles to act as plasma, the Debye length has to be sufficiently shorter than the internal length of the apparatus. If the plasma exists at above-described ion density in the treatment chamber, and with the assumption of 1 to 5 eV of electron temperature, the Debye length is calculated to about 0.3 to 0.7 m. Since, however, the internal length of actual semiconductor manufacturing apparatus is generally 0.3 m or less at the maximum, the above ion density in the treatment chamber suggests that the charged particles in the treatment chamber have no property of plasma.

Figure 4A:
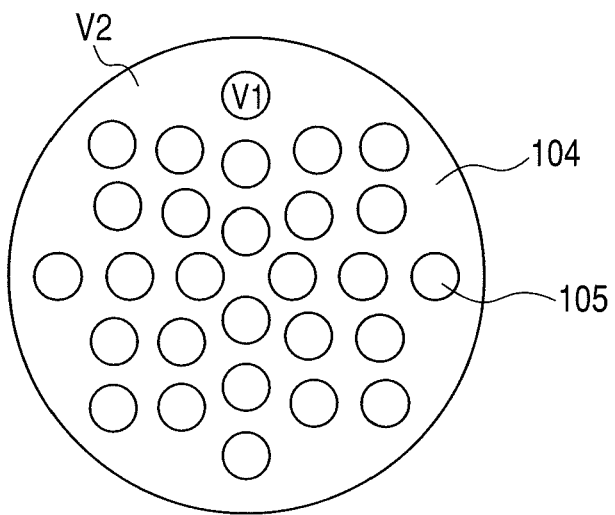
FIG. 4A is a schematic diagram of an example of structure of a high-frequency applying electrode part in the surface treatment apparatus of the present invention.
Figure 4B:
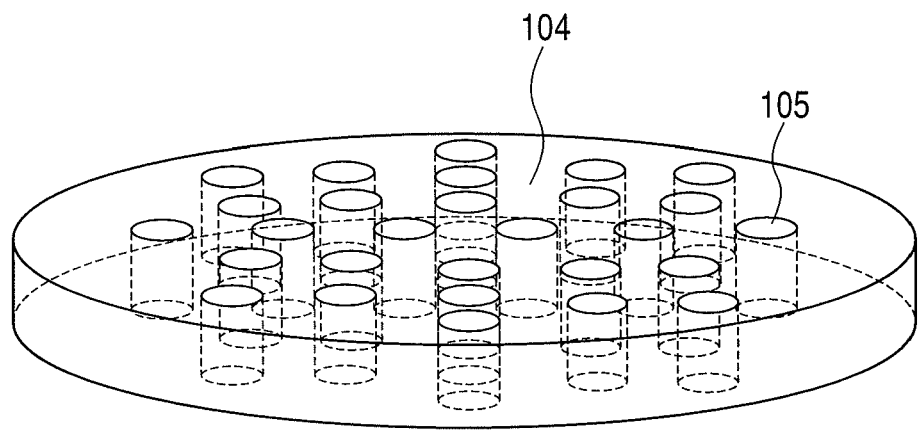
FIG. 4B is a perspective view of an example of structure of the high-frequency applying electrode part in the surface treatment apparatus of the present invention.
Figure 4C:
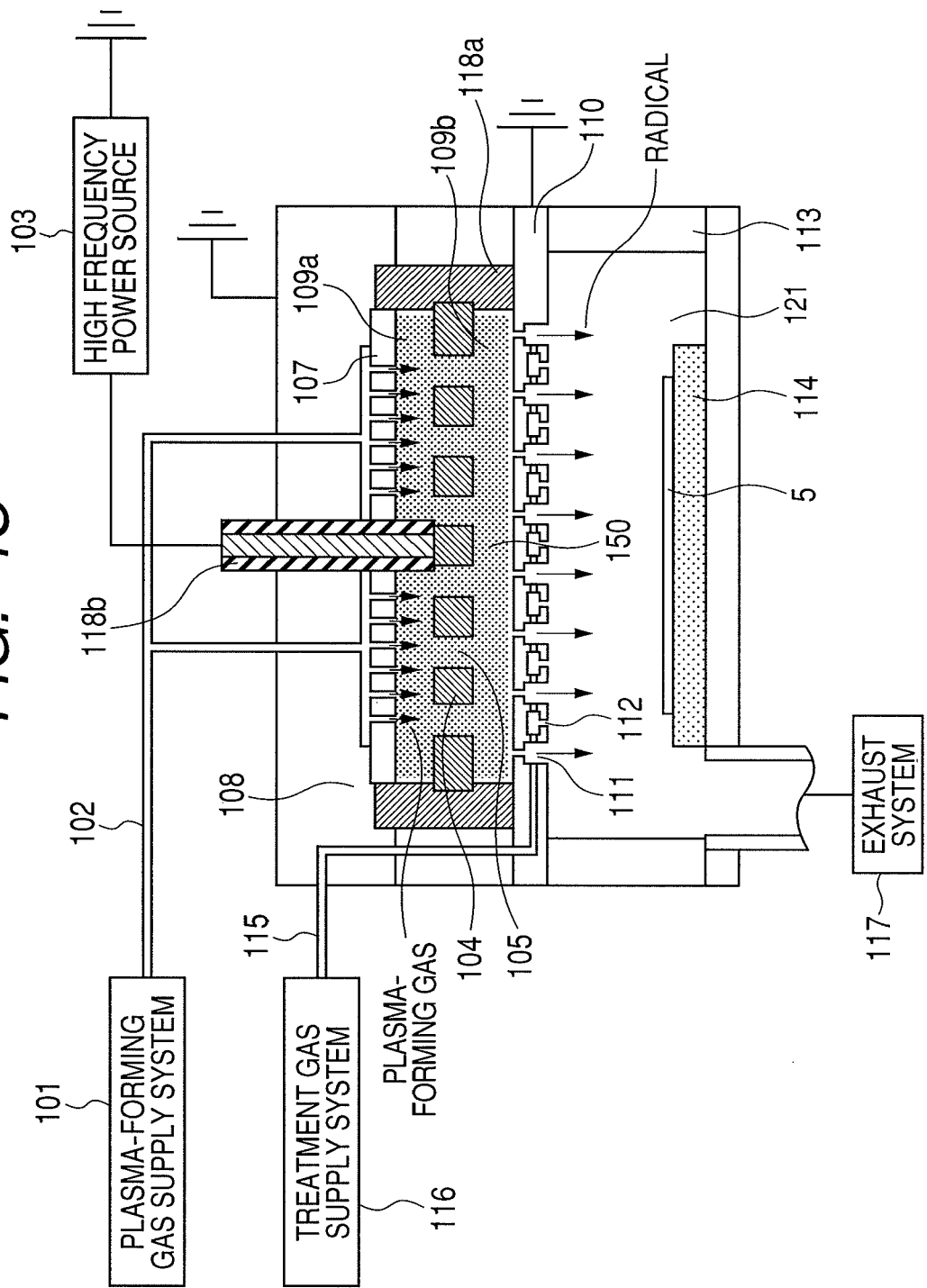
FIG. 4C is a diagram illustrating the generation of discharge in entire discharge chamber under a condition of V2/V1 in a range from 0.01 to 0.8 in the surface treatment apparatus of the present invention.
Figure 4D:
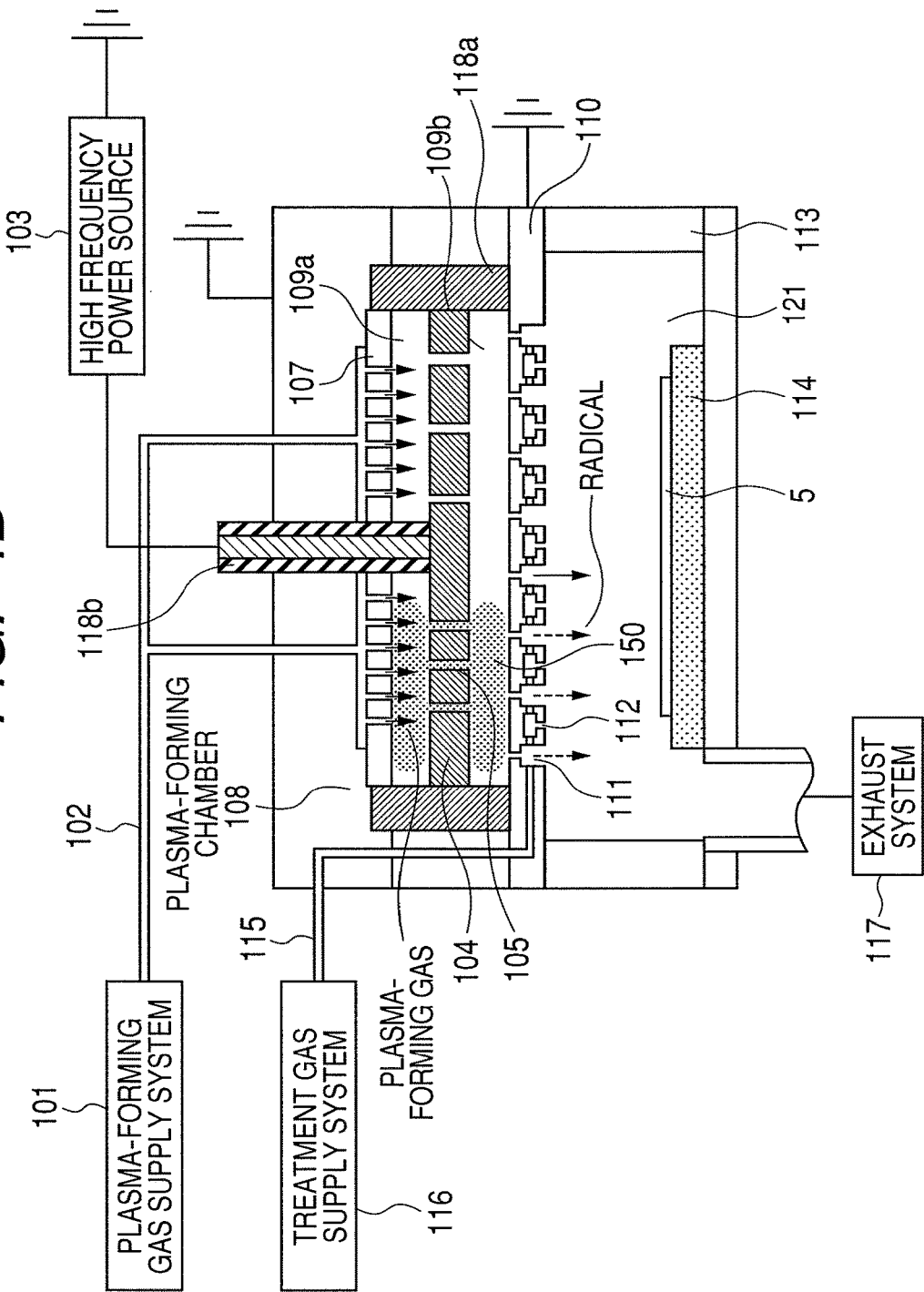
FIG. 4D is a diagram illustrating the state that, under a condition of V2/V1<0.01, the discharge disproportionates, resulting in non-uniform radical supply to the substrate in the surface treatment apparatus of the present invention.
Figure 4E:
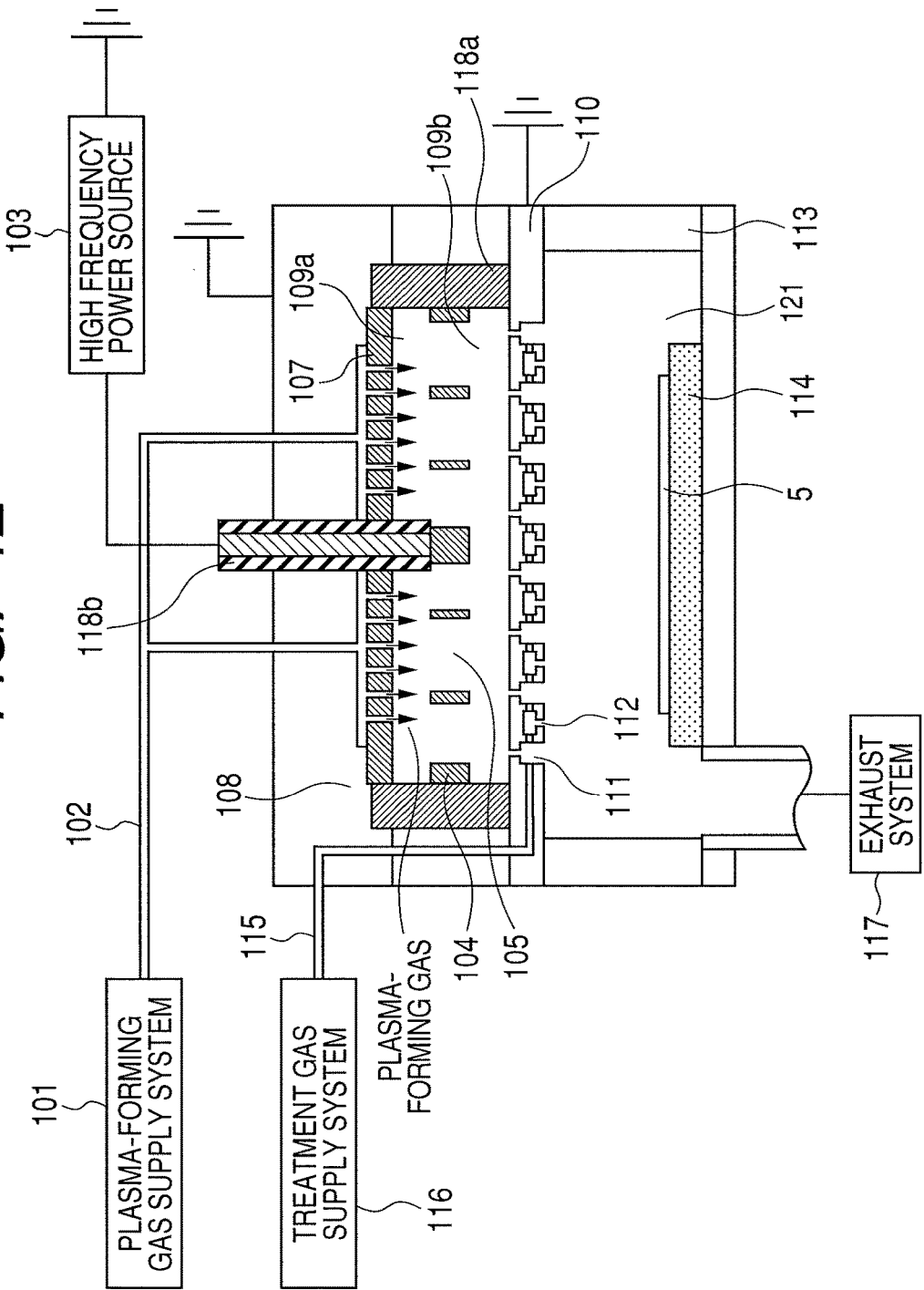
FIG. 4E is a diagram illustrating the state that, under a condition of V2/V1>0.8, the discharge does not occur, thus the radical supply is not given to the substrate in the surface treatment apparatus of the present invention.

FIG. 4A illustrates the high-frequency applying electrode 104 in a plate-shape extending in the lateral direction in the plasma-forming chamber 108 given in FIG. 1, viewed from above the apparatus. FIG. 4B is a perspective view of the high-frequency applying electrode. The high-frequency applying electrode 104 has a plurality of electrode through-holes 105 penetrating from the front face to the rear face thereof. The adopted through-holes 105 of the high-frequency applying electrode 104 are those having a shape given in FIG. 4A and FIG. 4B. Owing to the electrode through-holes 105, the electrode can uniformly discharge even at a low power of 0.25 W/cm$^2$ or less, thus the radicals are uniformly fed to the treatment chamber 113. The volume ratio of the volume V2 of the electrode through holes 105 to the total volume V1 of the high-frequency applying electrode 104 including the electrode through holes 105, V2/V1, is preferably in a range from 0.01 to 0.8. In a state of V2/V1 from 0.01 to 0.8, uniform discharge is attained as illustrated in FIG. 4C, thus the radicals are uniformly supplied to the treatment chamber. If the total volume V2 of the plurality of electrode through-holes 105 is excessively small, or V2/V1<0.01, the segregated discharge appears, as shown in FIG. 4D, to deteriorate the radical distribution. When V2/V1>0.8, discharge failed as shown in FIG. 4E to fail in supplying the radicals. To achieve stable and uniform radical distribution in small density of high frequency power, (from 0.001 to 0.25 W/cm$^2$), the ratio V2/V1 should at least be in a range from 0.01 to 0.8, preferably from 0.04 to 0.37. The example selected the range from 0.14 to 0.16.

The diameter of the plasma-forming gas feed hole 106 formed on the plasma-forming gas feed shower plate 107 is preferably 2 mm or smaller, and more preferably 1.5 mm or smaller. With the diameter of the plasma-forming gas feed hole 106 of 2 mm or smaller, and preferably 1.5 mm or smaller, the uniformity of the surface treatment of the substrate 5 significantly improved. As a result, it was found that the treatment time can be shortened. The phenomenon suggests that the radicals from plasma generated in the above-described plasma-forming spaces 109a and 109b and in the electrode through-hole 105 on the high-frequency applying electrode 104 can be stably and uniformly supplied to the substrate in the substrate cleaning treatment chamber 121. As for the minimum diameter of the plasma-forming gas feed hole 106, any value is applicable if only the hole 106 has a function of allowing the plasma-forming gas to pass therethrough.

If the diameter of the plasma-forming gas feed hole 106 was larger than 2 mm, the uniformity of surface treatment of the substrate 5 significantly deteriorated. The worsened uniformity needed a long treatment time. The phenomenon suggests that the uniform supply of radicals to the substrate cleaning treatment chamber 121 was failed.

Figure 5A:
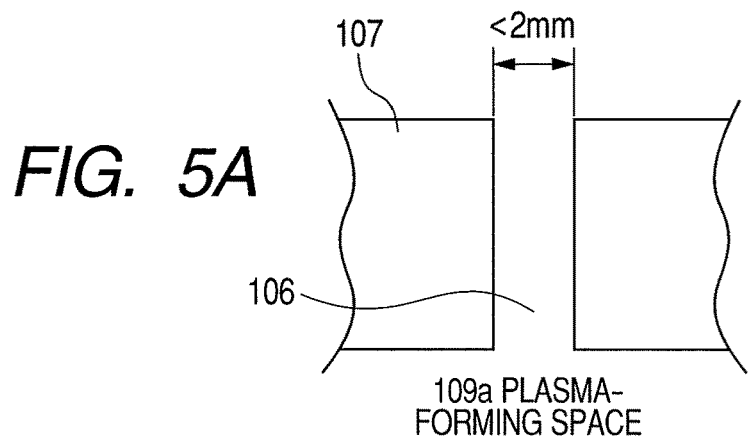
FIG. 5A is a schematic diagram illustrating an enlarged cross section of a plasma-forming gas feed shower plate in the vicinity of a plasma-forming gas feed hole, showing a shape example 1 of the plasma-forming gas feed hole.
Figure 5B:
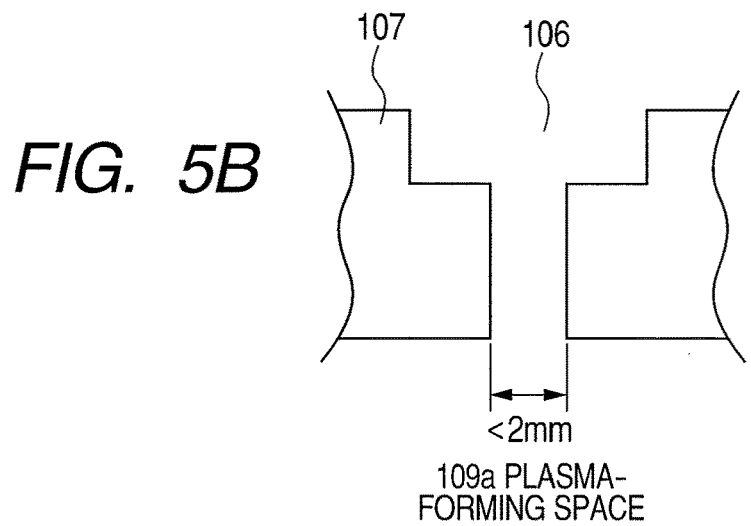
FIG. 5B is a schematic diagram illustrating an enlarged cross section of the plasma-forming gas feed shower plate in the vicinity of the plasma-forming gas feed hole, showing a shape example 2 of the plasma-forming gas feed hole.
Figure 5C:
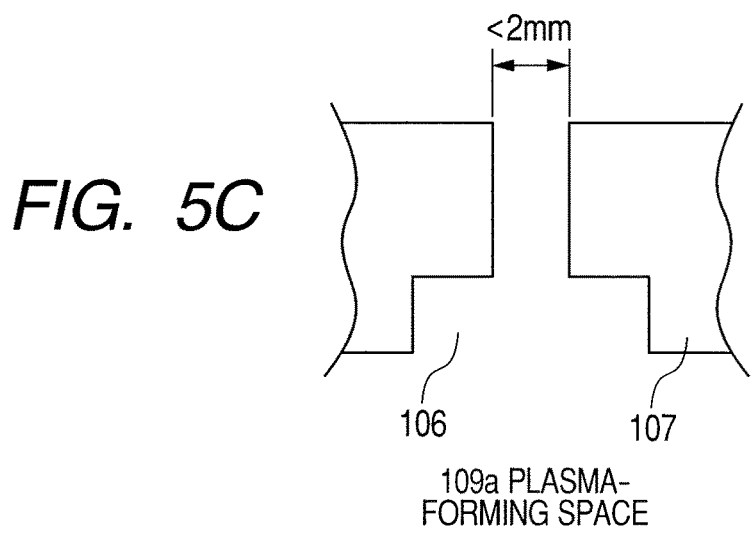
FIG. 5C is a schematic diagram illustrating an enlarged cross section of the plasma-forming gas feed shower plate in the vicinity of the plasma-forming gas feed hole, showing a shape example 3 of the plasma-forming gas feed hole.
Figure 5D:
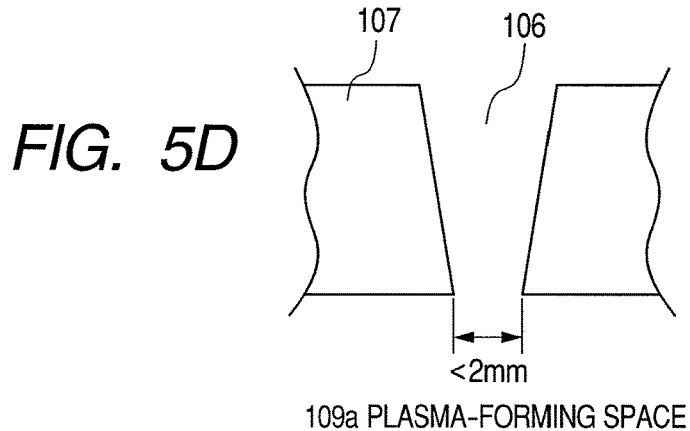
FIG. 5D is a schematic diagram illustrating an enlarged cross section of the plasma-forming gas feed shower plate in the vicinity of the plasma-forming gas feed hole, showing a shape example 4 of the plasma-forming gas feed hole.
Figure 5E:
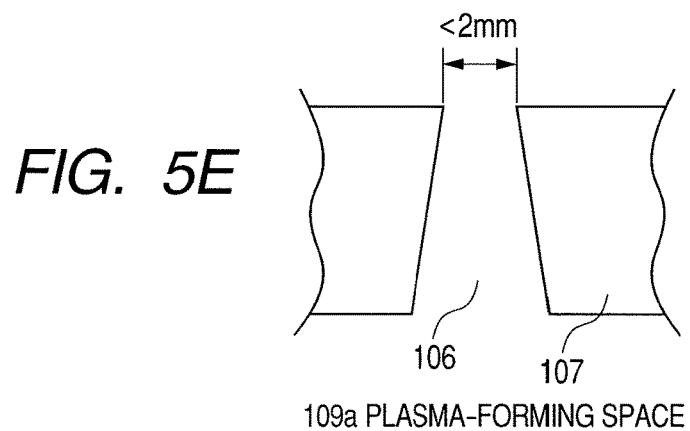
FIG. 5E is a schematic diagram illustrating an enlarged cross section of the plasma-forming gas feed shower plate in the vicinity of the plasma-forming gas feed hole, showing a shape example 5 of the plasma-forming gas feed hole.

Examples of the shapes of 2 mm or smaller diameter of the plasma-forming gas feed hole 106 on the plasma-forming gas feed shower plate 107 are given in FIGS. 5A to 5E. FIGS. 5A to 5E illustrate the respective enlarged cross sections of the plasma-forming gas feed shower plate 107 in the vicinity of the plasma-forming gas feed hole 106. As given in FIG. 5A, the plasma-forming gas feed hole 106 may be a vertical hole, or as given in FIGS. 5B and 5C, the plasma-forming gas feed hole 106 may have a spot-facing at one side thereof. The spot-facing may open to the side of plasma-forming space 109a as shown in FIG. 5C, or may open to other side as shown in FIG. 5B. As shown in FIGS. 5D and 5E, the plasma-forming gas feed hole 106 may be in a tapered shape, giving larger diameter thereof at the side of plasma-forming space 109a than the diameter at other side, as shown in FIG. 5E, or giving smaller diameter thereof at the side of plasma-forming space 109a than the diameter at other side, as shown in FIG. 5D. The examples of the hole shape are the same for the case of 1.5 mm or smaller diameter of the plasma-forming gas feed hole 106.

Figure 5F:
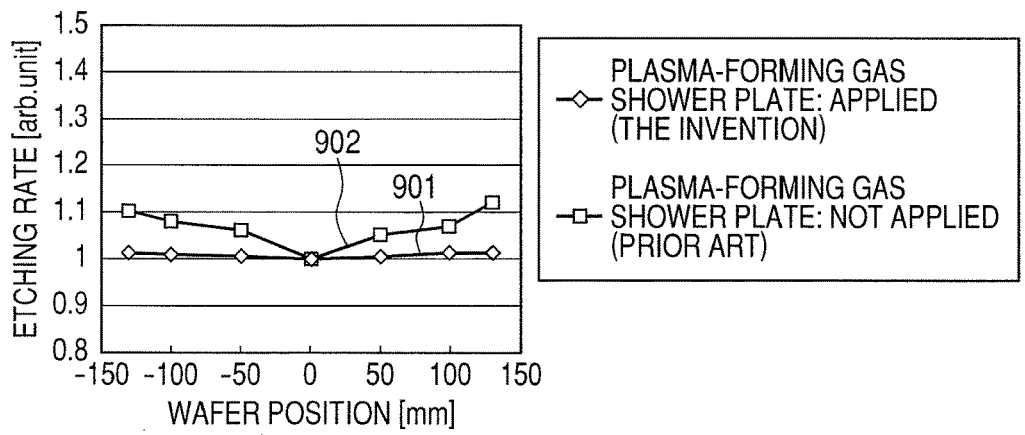
FIG. 5F is a graph of the distribution of etching rate of silicon oxide film in the plane of the substrate, showing the effect of the gas feed shower plate according to the present invention for feeding the plasma-forming gas to the plasma chamber.

FIG. 5F is a graph illustrating the effect of the plasma-forming gas feed shower plate 107 in the example. The etching rate of silicon oxide film on the substrate placed in the treatment chamber was determined under the conditions of: HF gas as the plasma-forming gas at 100 sccm of flow rate; high frequency power density of 0.01 W/cm$^2$, and the internal pressure of the treatment chamber of 50 Pa. In FIG. 5F, the horizontal axis is the position in the substrate face, and the vertical axis is the etching rate of silicon oxide film normalized by the etching rate at center of the substrate surface. As shown in FIG. 5F, when the case 901 which applied the plasma-forming gas feed shower plate was compared with the case 902 which did not apply the plasma-forming gas feed shower plate and applied lateral directional feed, as the feed method of the related art, the case 901 of feeding through the shower plate gave better uniformity in the in-plane etching rate. Presumable cause of the result is that the uniform gas feed to the plasma-forming space 109 secured uniform concentration distribution of active species in the plasma-forming space 109, and the phenomenon contributed to the result. Consequently, together with the effect of uniform plasma-forming owing to through-holes 105 of a high-frequency applying electrode 104 described below, there was confirmed further uniform radical supply to the treatment chamber.

A method of manufacturing a semiconductor device using the film-forming apparatus 1 illustrated in FIG. 1 of the present invention will be described below.

The description begins with a substrate treatment step as the first step, and with the condition thereof. The apparatus used in the first step is the substrate treatment apparatus 100 illustrated in FIGS. 3A to 3D.

As the plasma-forming gas, HF at 100 sccm of the flow rate was supplied to the plasma-forming chamber 108, thus generated plasma in the plasma-forming part. The radicals in the plasma were supplied to the treatment chamber 113 via the radical feed holes 111 formed on the plasma-confinement electrode plate 110 for plasma separation provided with the plurality of radical-passing holes 111. To suppress the excitation energy of the radicals, HF as the treatment gas was supplied to the treatment chamber 113 via the treatment gas feed holes 112 at a flow rate of 100 sccm. The high frequency power density for plasma generation was 0.01 W·cm$^2$, the pressure was 50 Pa, the treatment time was 5 min, and the temperature of the substrate 5 was 25° C. The plasma for substrate cleaning treatment is generated at a high frequency power density in a range from 0.001 to 0.25 W/cm$^2$, which range is about several tenth to one severals to that of the plasma in the case of film-deposition treatment. Higher density of high frequency power than that level makes it difficult to conduct selective etching of native oxide film.

Figure 12:
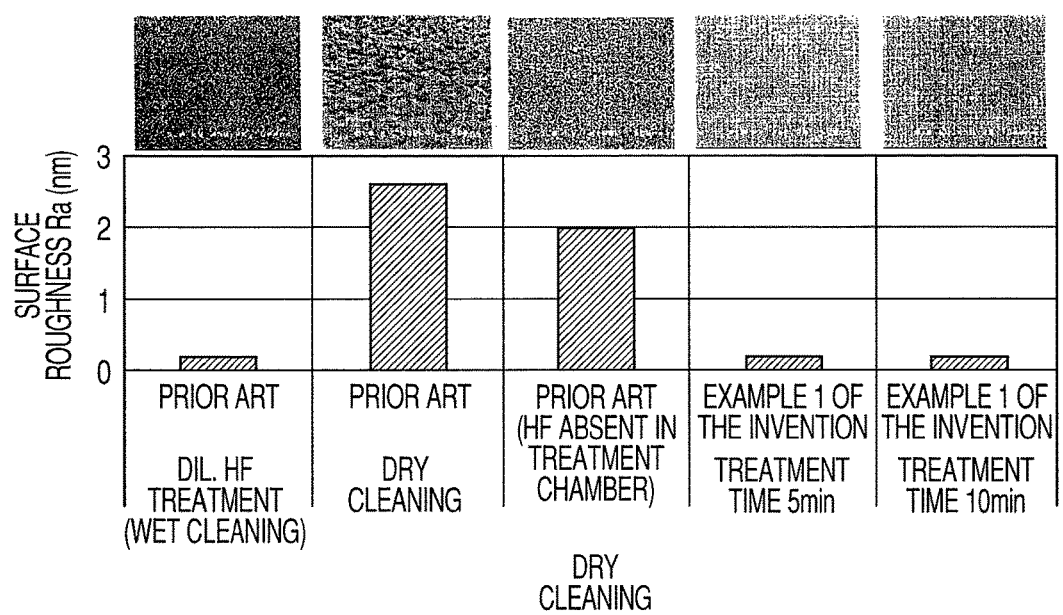
FIG. 12 gives a graph showing the surface roughness (Ra) after treatment of the substrate, and SEM images on the surface, obtained by an example of the present invention.

FIG. 12 shows the observed surface roughness after the first step of the present invention, with the comparison with the result of conventional dry-treatment and wet-treatment. As shown in FIG. 12, the surface roughness Ra obtained from the first step of the present invention was 0.18 nm, which is a good level almost equal to the surface roughness Ra of 0.17 nm obtained by the wet-treatment (wet-cleaning) with a dilute hydrofluoric acid solution. For the case of not supplying the HF gas as the treatment gas, the surface roughness Ra became 2.0 nm, which is a large level. Furthermore, even when the treatment time was extended to 10 minutes, the surface roughness Ra was confirmed to 0.19 nm, which is not a rough level. The improved surface flatness owes to the selective removal of the surface native oxide film and organic matter in relation to Si. Presumable mechanism is that the high excitation energy HF generated from plasma is brought to collide with the unexcited HF separately fed as the treatment gas, thus forming HF having suppressed excitation energy, and the suppressed excitation energy HF selectively removes the surface native oxide film while not etching the Si atoms on the surface. The observed results confirmed that the use of the present invention can realize the surface flatness, equivalent to that of the wet-cleaning, by the dry-cleaning which does not need the high temperature pretreatment.

The condition to attain the surface flatness according to the present invention is only to form HF having suppressed excitation energy by mixing and colliding an HF having high excitation energy generated from the plasma with an unexcited HF separately fed as the treatment gas. Consequently, the structure of the example is not limited if only the above condition is satisfied.

That is, according to this example, the radicals generated by the plasma are supplied toward the substrate via the radical feed holes 111 as the plurality of through-holes formed on the plasma-confinement electrode plate 110, while simultaneously supplying the treatment gas via the plurality of treatment gas supply holes formed on the electrode plate. From the point of uniformity, however, and specifically when uniform treatment is required to a large diameter substrate, it is necessary to supply both the radicals and the unexcited treatment gas uniformly to the substrate. To this end, as in this example, it is preferable to adopt the structure which allows radicals to be shower-supplied from the electrode plate facing the substrate, and allows also the treatment gas to be shower-supplied simultaneously.

Figure 7:
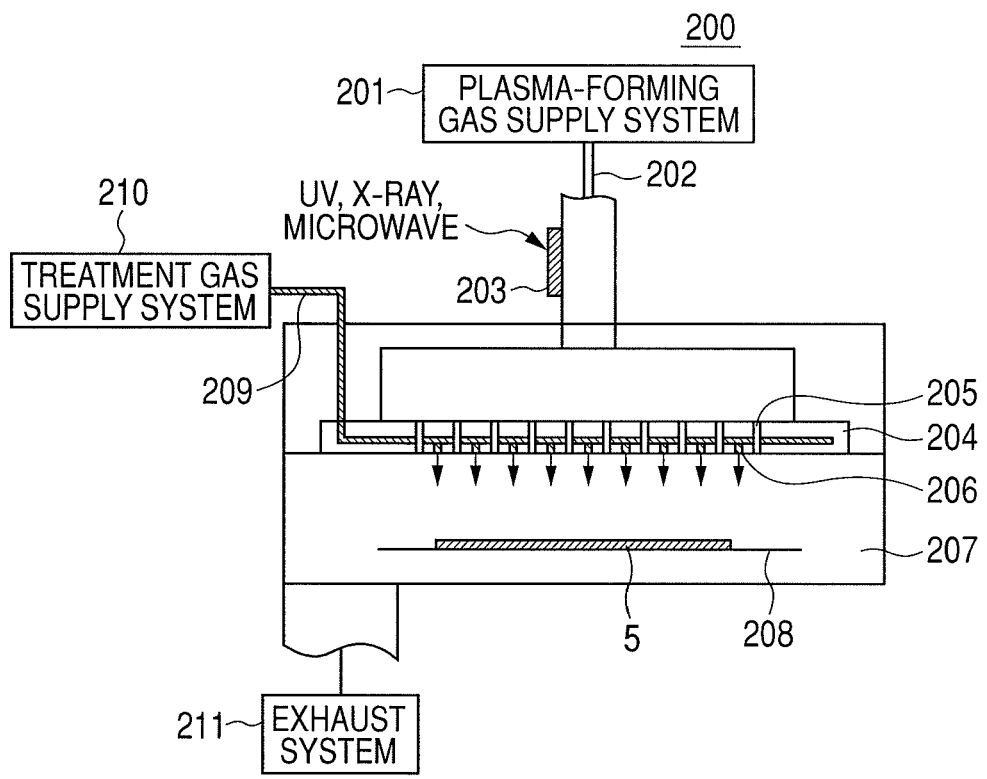
FIG. 7 is a schematic diagram illustrating an example of structure of a UV, X-ray, and microwave excited radical surface treatment apparatus used in the present invention.
Figure 8:
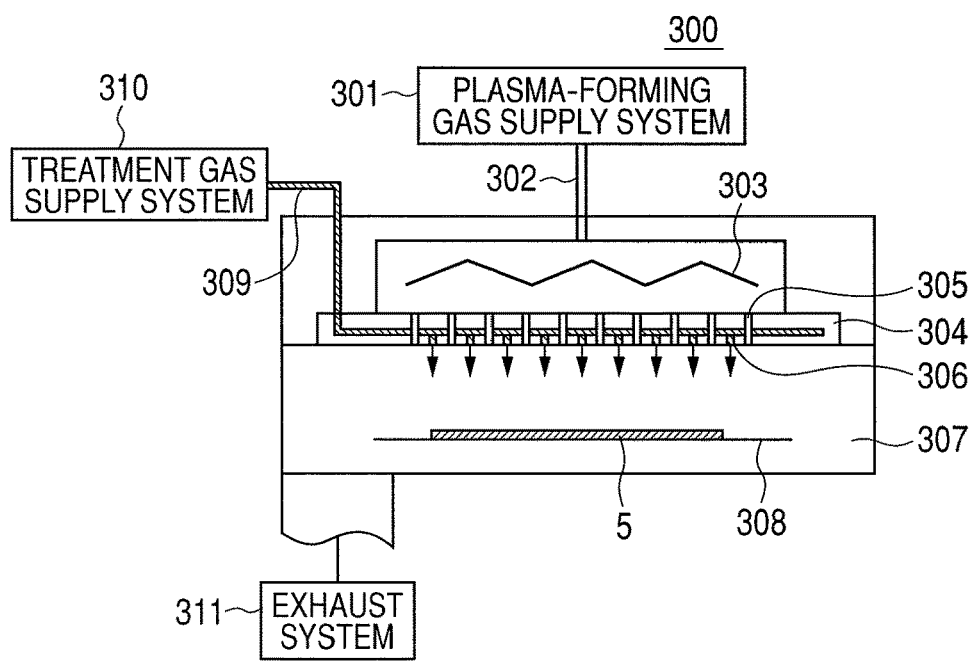
FIG. 8 is a schematic diagram illustrating an example of structure of a catalyst-chemical excitation radical surface treatment apparatus used in the present invention.
Figure 9A:
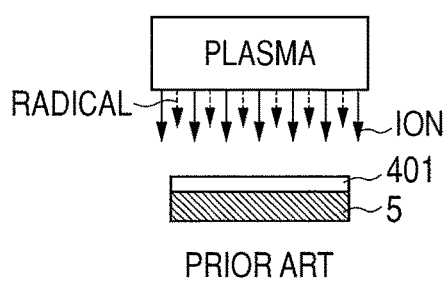
FIGS. 9A and 9B are schematic diagrams illustrating a surface treatment method used in the prior art and a surface treatment method used in the present invention.
Figure 9B:
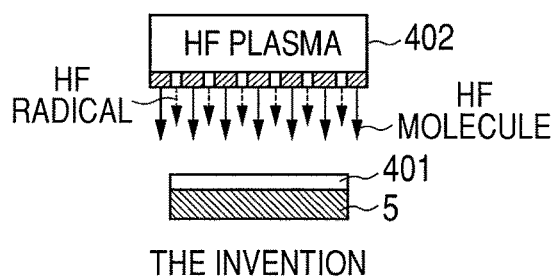

Although the example conducts the radical generation by the plasma formation by the high frequency application, the radical generation may be done by the plasma formation by microwave and other methods. Specifically, there may also be applied the radical generation through UV, X-ray, and microwave excitation given in FIG. 7, and the catalyst-chemical excitation given in FIG. 8. In FIG. 7, UV, X-ray, and microwaves are irradiated to the plasma gas from a feed chamber 203 to turn the plasma gas into plasma. In FIG. 7, reference numeral 5 signifies the substrate; 201, the plasma-forming gas supply system; 202, the plasma-forming gas supply pipe; 204, the plasma-confinement electrode plate for plasma separation provided with the plurality of radical-passing holes; 205, the radical feed hole; 206, the treatment gas feed hole; 207, the treatment chamber; 208, the substrate holder; 209, the treatment gas supply pipe; 210, the treatment gas supply system; and 211, the exhaust system. The treatment gas system has the same structure with that of FIGS. 3A to 3D. FIG. 8 illustrates the structure of turning the gas into plasma by a heating catalyst body 303. Reference numeral 5 signifies the substrate; 301, the plasma-forming gas supply system; 302, the plasma-forming gas supply pipe; 304, the plasma-confinement electrode plate for plasma separation provided with the plurality of radical-passing holes; 305, the radical feed hole; 306, the treatment gas feed hole; 307, the treatment chamber; 308, the substrate holder; 309, the treatment gas supply pipe; 310, the treatment gas supply system; and 311, the exhaust system. The treatment gas system has the same structure with that of FIGS. 3A to 3D.

Regarding the plasma-forming gas fed to the plasma-forming chamber, the example used only HF. The plasma-forming gas is only required to contain at least HF, and specifically HF diluted with Ar may be used. By generating plasma, and by passing the plasma through the plasma-confinement electrode plate 110, the radicals enter the treatment chamber 113. For the treatment gas entering the treatment chamber 113, the example used only HF. The treatment gas is only required to contain at least HF, and specifically HF diluted with Ar may be used. By mixing the radicals which were fed to the treatment chamber 113 via the radical feed holes 111 formed on the plasma-confinement electrode plate 110 with the treatment gas fed from the treatment gas feed holes 112, there is created an atmosphere in which the excitation energy of radicals is suppressed. Then, the native oxide film and the organic matter on the surface of the substrate are selectively removed in relation to Si of the substrate material, thereby performing the substrate surface treatment while suppressing the surface roughening.

Figure 13:
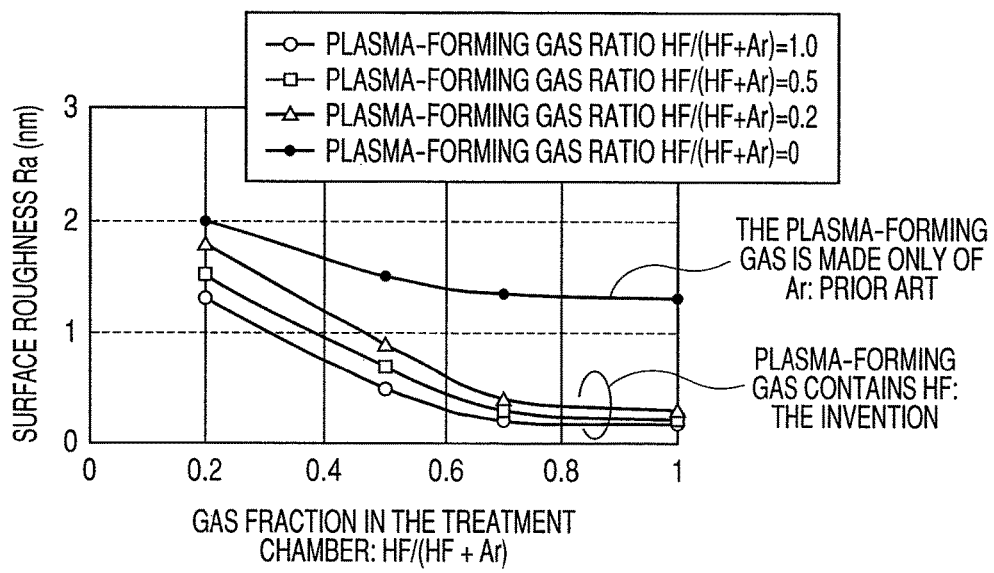
FIG. 13 is a graph showing the dependency of the surface roughness (Ra) on the HF fraction in the treatment gas, comparing the case of plasma-forming gas containing HF according to the present invention with the case of plasma-forming gas made only of Ar in the related art.

FIG. 13 is a graph of dependency of the surface roughness (Ra) on the HF fraction in the treatment gas, comparing the case of plasma gas containing HF according to the present invention with the case of plasma gas made only of Ar in the related art.

According to Japanese Patent Laid-Open No. 10-172957 of the related art, the oxide film was able to be selectively removed by a mixed gas of: argon, helium, xenon, and hydrogen which are excited by a remote plasma source; and HF gas fed in downstream side, and that no damage was observed on the silicon substrate. The removal, however, did not satisfy the flatness level required in recent years. The expression of HF fraction in the plasma-forming gas, HF/(HF+Ar)=0, signifies the case of related art using sole Ar gas as the plasma-forming gas. As shown in FIG. 13, compared with the case of sole Ar as the plasma-forming gas in the related art, or HF/(HF+Ar)=0, the case of the present invention of containing HF in the plasma-forming gas provides significantly good surface roughness (Ra). Varied mixing ratio of HF to Ar in the plasma-forming gas and in the treatment gas varied the surface roughness after removing the native oxide film. It was found that the HF fraction in the plasma-forming gas to the total gas flow rate of the plasma-forming gas is preferably in a range from 0.2 to 1.0, and further to attain the surface roughness of 0.5 nm or smaller equivalent to the surface roughness after the wet-cleaning, the HF fraction thereto is preferably in a range from 0.6 to 1.0. The surface roughness after removing the native oxide film became minimum, or became flat, in the case of sole HF of the plasma-forming gas and of the treatment gas.

Even for the case that HF gas was used as the plasma-forming gas to be supplied to the plasma-forming chamber 108, and that the radicals were supplied via the plurality of radical feed holes 111 formed on the plasma-confinement electrode plate 110 for plasma separation provided with a plurality of radical-passing holes 111, when the treatment gas was composed only of Ar, the native oxide film on the surface of the substrate was not able to be removed, and failed to attain the object of the surface treatment. For the case that HF gas was used as the plasma-forming gas and that no gas was supplied as the treatment gas, the surface roughness Ra became 2.5 nm, which was worse than the case of using HF as the treatment gas.

The example used a Si substrate. However, the substrate surface treatment of the present invention does not limit to the surface treatment of Si substrate. In concrete terms, the request is only to structure the substrate surface with a group IV semiconductor such as Si and SiGe. More specifically, the substrate surface treatment can be applied to the one for removing native oxide film and organic contamination on the surface of group IV semiconductor such as thin Si layer which is adhered to or deposited on a glass substrate.

The high frequency power density applied onto the high-frequency applying electrode 104 is preferably in a range from 0.001 to 0.25 W/cm$^2$.

Figure 6:
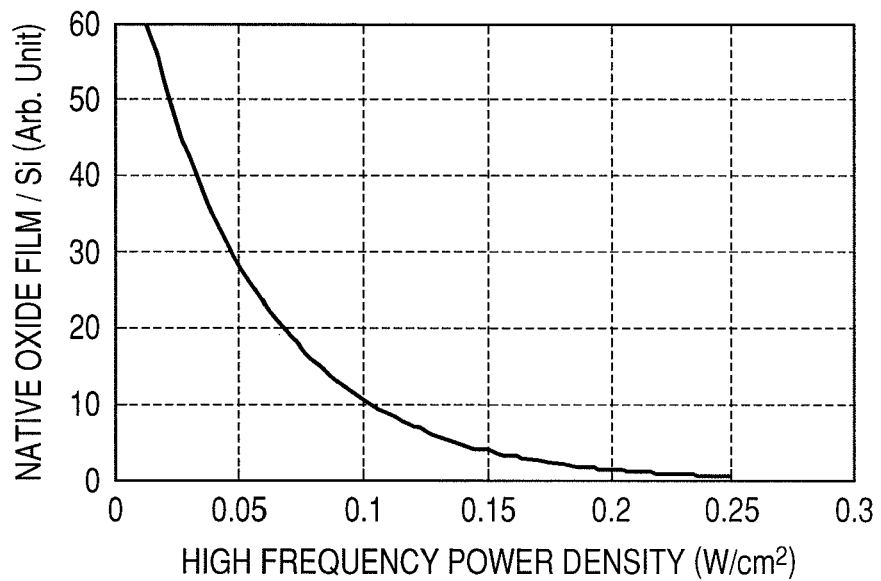
FIG. 6 is a graph showing native oxide film/Si obtained in the examples of the present invention with varied high-frequency power density.

FIG. 6 shows the dependency of the native oxide film/Si, (etching rate ratio of native oxide film to Si), on the high frequency power density for the case of using HF gas as the plasma-forming gas and using HF as the treatment gas. Decrease in the high frequency power density suppresses the Si etching, and thus only the native oxide film is selectively etched. The value of the amount of etching the native oxide film divided by the amount of etching the Si is defined as "native oxide film/Si". Decrease in the high frequency power density relatively decreases the amount of etching of Si so that the "native oxide film/Si" increases. On the other hand, increase in the high frequency power density significantly increases the etching of Si, thus decreasing the "native oxide film/Si". Increase in the high frequency power density induces the etching of Si, which roughens the surface. To decrease the surface roughening, it is necessary to increase the "native oxide film/Si" and to decrease the high frequency power density. To this end, the high frequency power density is selected to above range of from 0.001 to 0.25 W/cm$^2$, preferably from 0.001 to 0.125 W/cm$^2$, and most preferably from 0.001 to 0.025 W/cm$^2$.

Then, the description is given to the Si and SiGe epitaxial single crystal growth step as the second step, and to the condition thereof.

The description is for the process in which the first step is conducted using the film-forming apparatus 1 given in FIG. 1 and using the surface treatment apparatus 100 given in FIGS. 3A to 3D to remove the native oxide film formed on the Si substrate, and then the substrate is transferred to a CVD apparatus 20 via the vacuum transfer chamber 60 to conduct the second step, where the growth of Si and SiGe single crystal film proceeds on the treated surface of the substrate.

Figure 14A:
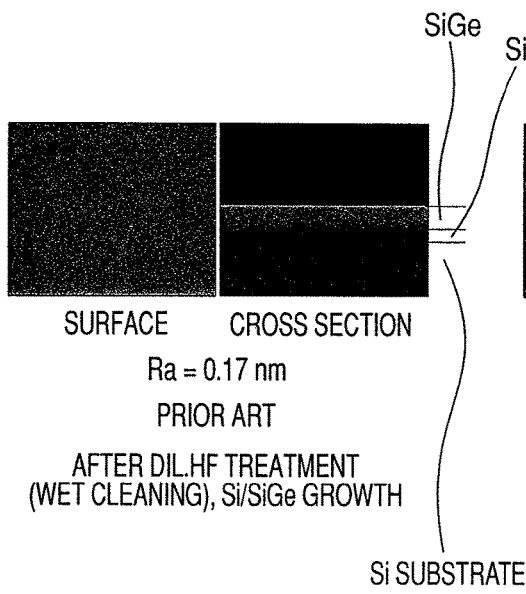
FIGS. 14A and 14B give SEM images on the surface after the growth of Si and SiGe, obtained by an example of the related art and of the present invention, respectively.
Figure 14B:
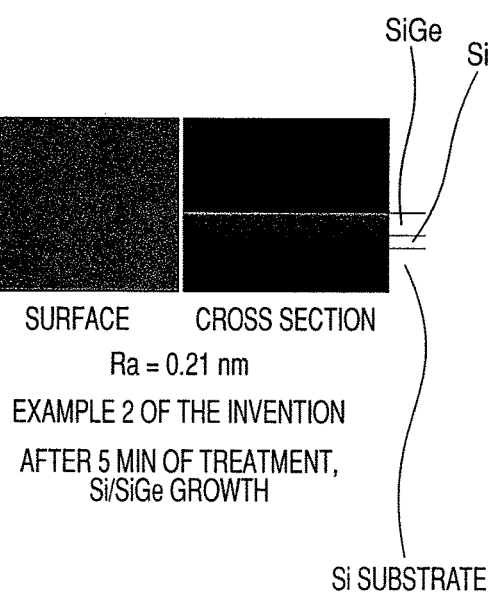
Figure 15:
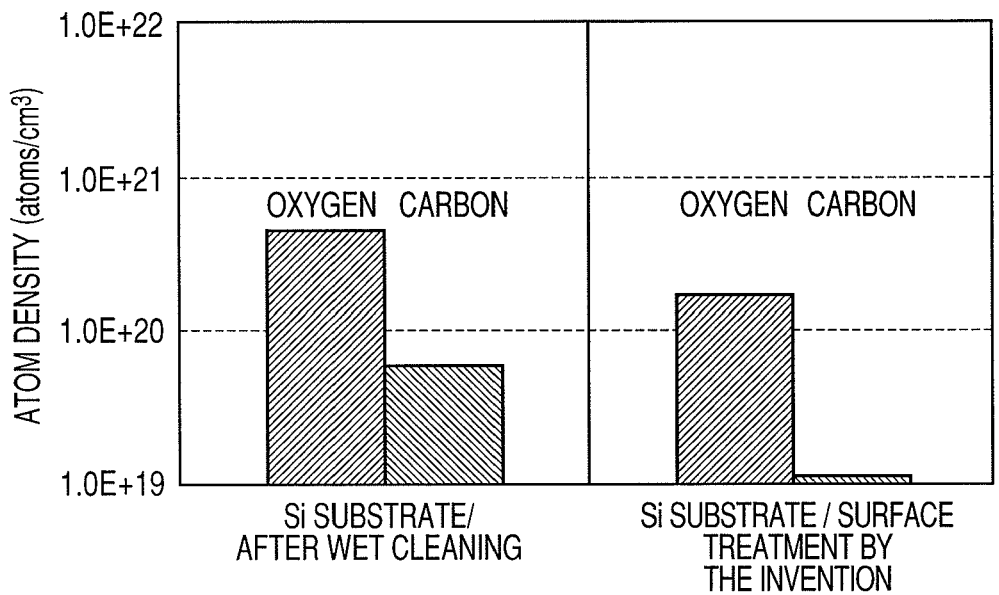
FIG. 15 is a graph showing the atom density of oxygen and carbon at interface, obtained by an example of the present invention.

The substrate was treated on the surface thereof in the first step, and then was treated in the CVD apparatus 20 as the second step under the condition of: substrate temperature of 600° C., $Si_2H_6$ supply at 36 sccm, pressure holding at 2 E–3 Pa, for 3 minutes. After that, the substrate was treated therein under the condition of: substrate temperature of 600° C., $Si_2H_6$ and $GeH_4$ supply at 36 sccm, respectively, pressure holding at 4 E–3 Pa, for 3 minutes. Thus treated substrate gave a surface roughness of the SiGe single crystal growth on the Si equivalent to the surface roughness of the substrate treated by wet-cleaning using a diluted hydrofluoric acid, providing a good SiGe single crystal film, as shown in FIGS. 14A and 14B. As given in FIG. 15, compared with the case of wet-cleaning followed by the above Si/SiGe growth, the case of this example gave smaller atom density of oxygen and carbon at the interface between the Si substrate and the grown Si. In concrete terms, the atom density of oxygen and carbon at the interface was $2 \times 10^{20}$ atoms/$cm^3$ or less. The phenomenon owes to the suppression of adsorption of oxygen and carbon impurities onto the surface by the vacuum transfer of the substrate without exposing thereof to atmospheric air after cleaning. In the process of growth of Si and SiGe single crystal film in the CVD apparatus 20, there can be used: a hydrogenated gas such as $Si_2H_6$ and $GeH_4$; a mixture of a hydrogenated gas with a doping material gas such as $B_2H_6$, $PH_3$, and $AsH_3$; or $SiH_4$ instead of $Si_2H_6$.

The description is given to the dielectric film sputtering film-forming step as the third step, the oxidation-nitrification step of the formed dielectric film as the fourth step, and the electrode sputtering step as the fifth step. Succeeding to the second step, the substrate is subjected to a process to manufacture the FET device. The process includes: the third step of sputtering film-formation of the dielectric material in a sputtering apparatus 40 via the transfer chamber 60; the fourth step of transferring the substrate through the transfer chamber 60 to the oxidation-nitrification apparatus 30 to oxidize the dielectric material therein; and the fifth step of transferring the substrate through the transfer chamber 60 to the sputtering apparatus 40 to sputter the metal electrode material therein. The apparatus 10 through 50 are each controlled by the respective transfer or process controllers 70 through 74.

The dielectric material film-forming in the third step may be conducted by CVD other than sputtering. Similarly, the film-forming of metal electrode material in the fifth step may be conducted by CVD other than sputtering.

With the surface treatment apparatus 100 illustrated in FIG. 3A, the first step was conducted to remove the native oxide film, and the second step was conducted to grow the Si single crystal film. Then, the substrate 5 passed through the vacuum transfer chamber 60 to enter the dielectric-electrode sputtering apparatus 40 without being exposed to atmospheric air, where the sputtering film-formation of Hf was conducted, and the substrate was transferred to the oxidation-nitrification apparatus 30 via the vacuum transfer chamber 60 to oxidize the formed dielectric material film without exposing the surface of the dielectric material to atmospheric air, thus conducted plasma and radical oxidation. Furthermore, the substrate 5 was transferred to the dielectric-electrode sputtering apparatus 40 via the vacuum transfer chamber 60 without being exposed to atmospheric air, thus sputtered to form the film of TiN electrode. The characteristics of the obtained device were evaluated. The data are given in FIG. 16, FIG. 17, and FIG. 18.

FIG. 15 shows a C-V curve drawn by measuring the capacitance of a sample prepared by the present invention and by the related art (wet-cleaning was applied instead of the first step), respectively, applying voltage to the electrode part. Compared with the sample of the related art which provided hysteresis of about 30 mV, the sample of the present invention attained good result of 10 mV of hysteresis.

Figure 17:
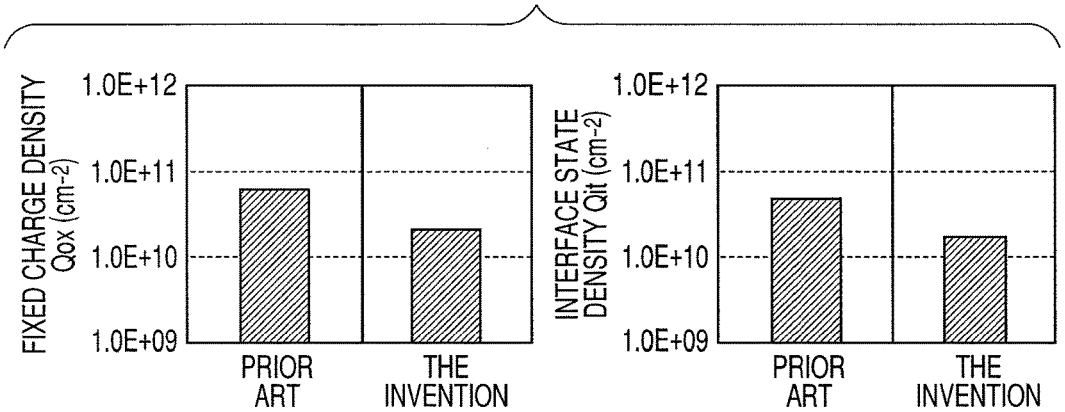
FIG. 17 is a graph showing a comparison of the interface state density and the fixed charge density, between those obtained by an example of the present invention and those obtained in the related art.
Figure 18:
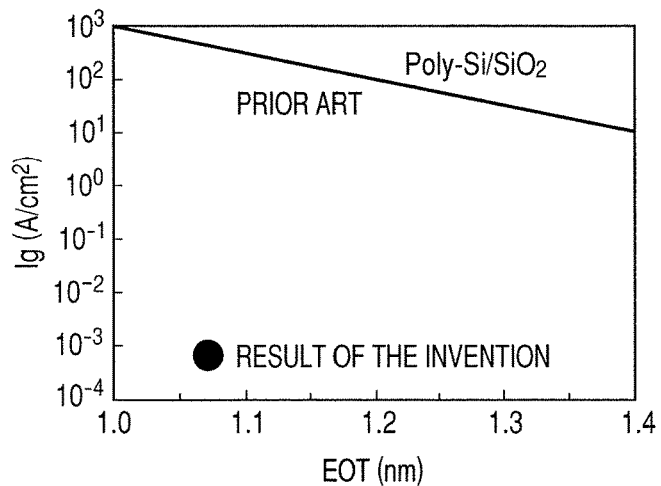
FIG. 18 is a graph showing the relation between the equivalent oxide film thickness (EOT) and the leak current, obtained by an example of the present invention.

FIG. 17 shows a comparison of the interface state density and the fixed charge density, between those obtained by the present invention and those obtained in the related art (wet-cleaning was applied instead of the first step). Samples were prepared by the process of the present invention to determine the C-V curve, from which curve the interface state density and the fixed charge density were calculated. Both the interface state density and the fixed charge density were smaller than those in the related art because of the small quantity of oxygen and carbon impurities on the surface of Si film formed by the second step after the substrate cleaning in the first step, as shown in FIG. 15. The phenomenon is the effect of continuous treatment in vacuum after the dry-cleaning.

Figure 2:
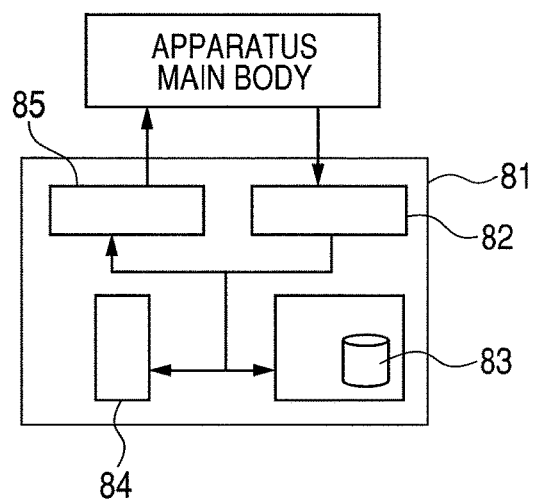
FIG. 2 is a schematic diagram of a controller installed in the apparatus used in the present invention.

The film-forming apparatus 1 illustrated in FIG. 1 has a controller to conduct entire process in vacuum for each process apparatus and for each transfer apparatus. That is, a transfer controller receives the input signal, generated from the apparatus concerned, at input part, runs the transfer program which was programmed so as to operate according to the flowchart on the processor, and thus outputs the action command for transferring the substrate to each process apparatus to the concerned apparatus via the vacuum transfer. Process controllers A 71 through D 74 receive the input signal from the process apparatus, run the program which was programmed so as to operate the treatment according to the flowchart, and thus output the action command to the apparatus concerned. The structure of the controller 70 or 71 to 74 is the one given as the reference numeral 81 in FIG. 2, composed of an input part 82, a memory part 83 having a program and data, a processor 84, and an output part 85. The structure is basically a computer structure, which controls the concerned apparatus.

Figure 10A:
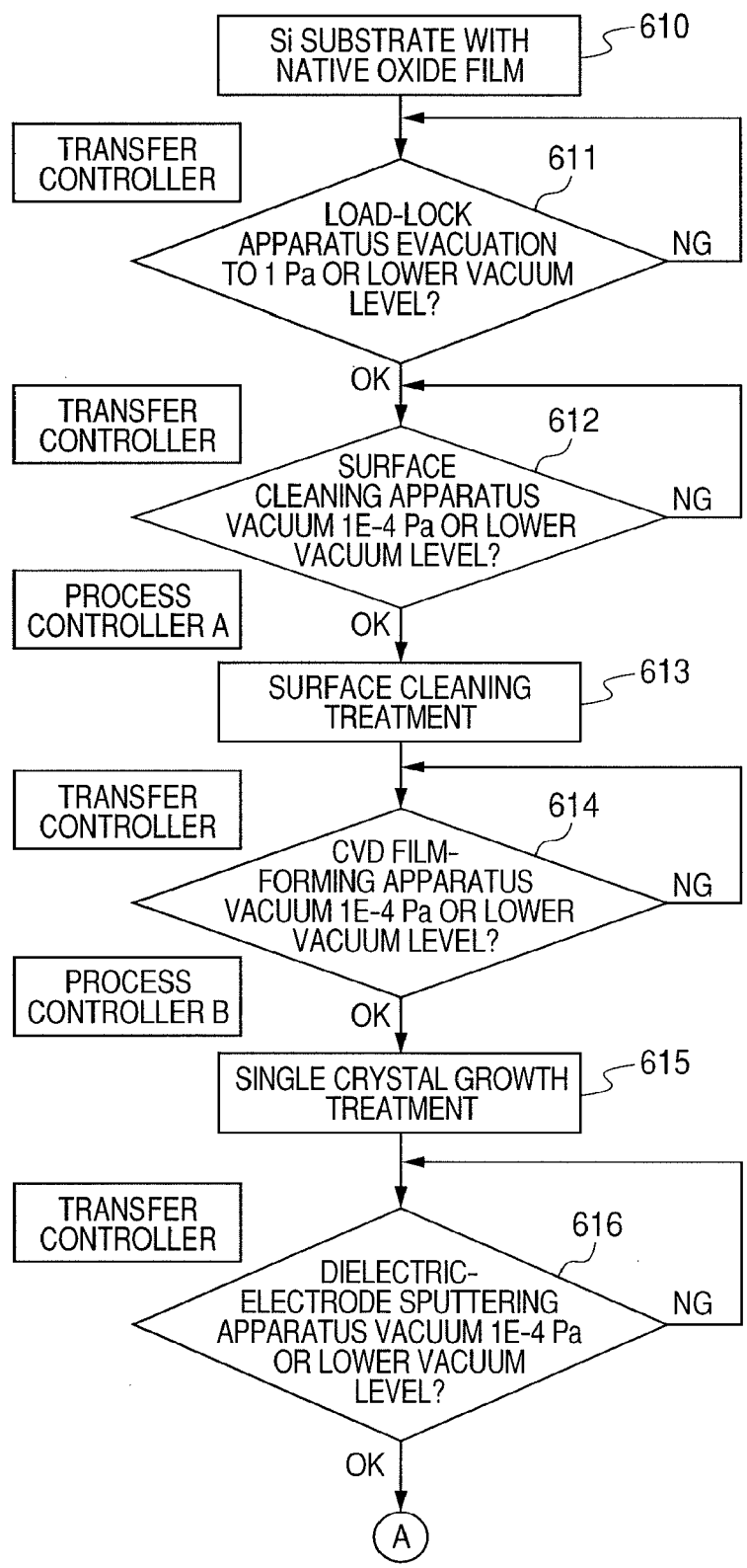
FIGS. 10A and 10B are a flowchart of a transfer controller program used in the present invention.
Figure 10B:
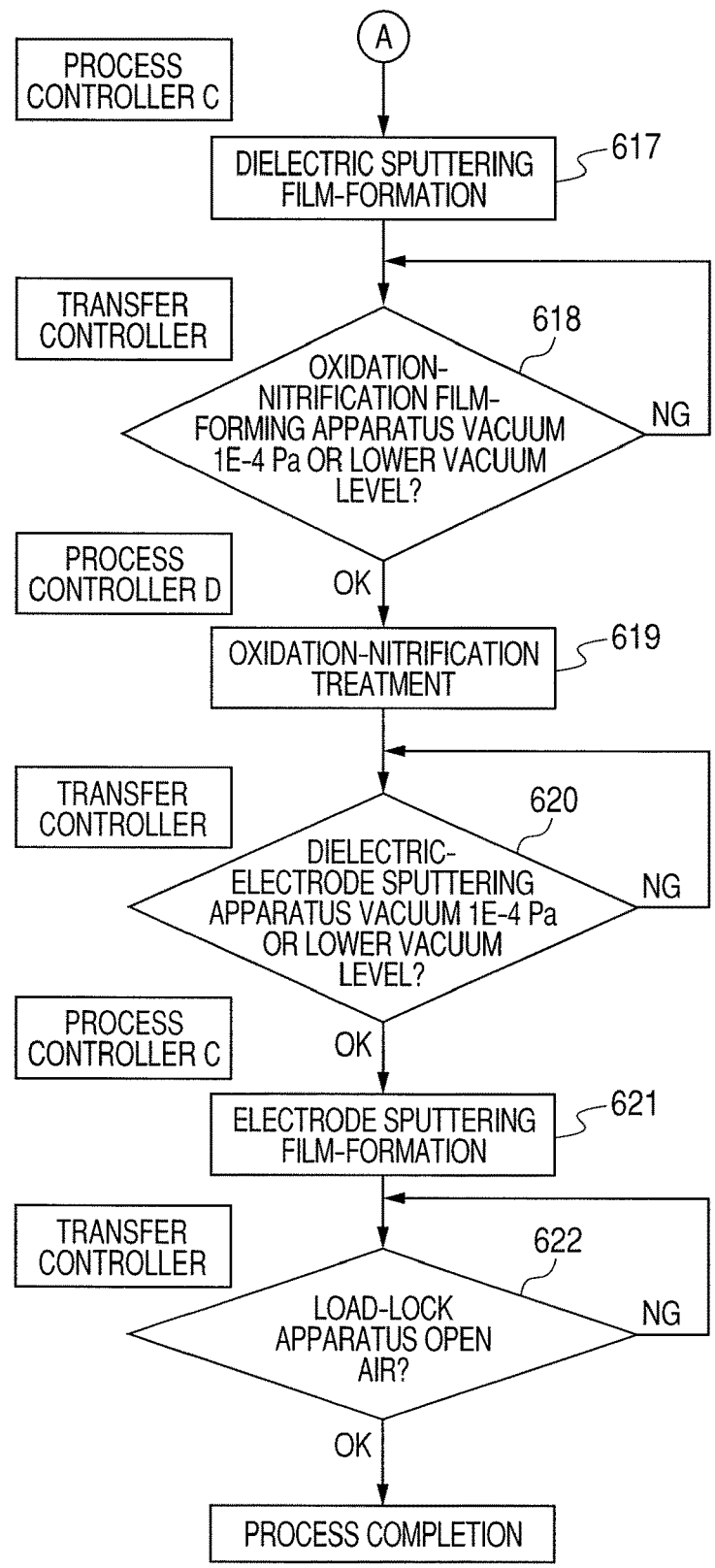
Figure 11:
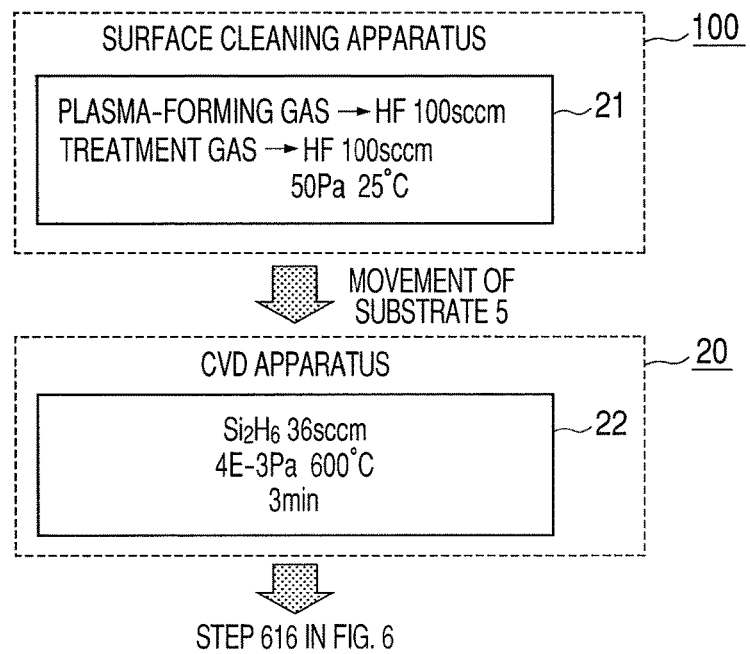
FIG. 11 is a flowchart of a film-forming controller program used in the present invention.

FIGS. 10A and 10B illustrate the control of the transfer controller 70 and the process controllers A to D (71 to 74). FIG. 10B is a continuation of the flow chart in FIG. 10A. In Step 610, a Si substrate with native oxide film formed thereon is prepared. The transfer controller 70 generates a command to bring the vacuum in the load-lock apparatus 40 to 1 Pa or below, (Step 611). Further the transfer controller generates a command to bring the vacuum in the surface treatment apparatus 100 to 1E–4 Pa or higher vacuum level, and then moves the substrate 5 into the surface treatment apparatus 100 via the transfer chamber 60 to place the substrate on the substrate holder. The process controller A71 controls the procedure of above-described first step of applying surface treatment to the substrate 5, (Step 613).

The transfer controller 70 controls the CVD film-forming apparatus 20 to evacuate to establish the vacuum of 1E–4 Pa or lower vacuum level, and then moves the substrate 5 from the surface treatment apparatus 100 to the CVD film-forming apparatus 20 to place the substrate 5 therein via the transfer chamber 60.

The process controller B72 controls the above-described second step of treating single crystal growth in the CVD film-forming apparatus 20, (Step 615). Immediately after that, the process controller B72 moves the substrate into the dielectric-electrode sputtering apparatus 40 via the transfer chamber 60 to conduct the third step of dielectric-electrode sputtering film-forming (Step 616).

The process controller C73 controls the third step of film-forming treatment in the dielectric-electrode sputtering apparatus 40 (Step 617). The transfer controller 70 establishes the vacuum of 1E-4 Pa or lower vacuum level in the oxidation-nitrification apparatus 30, and moves the substrate 5 from the dielectric-electrode sputtering apparatus 40 to the oxidation-nitrification apparatus via the transfer chamber 60 (Step 618). The process controller D74 conducts control to execute the fourth step in the oxidation-nitrification apparatus 30 (Step 619). Immediately after that, the process controller D74 moves the substrate 5 to the dielectric-electrode sputtering apparatus 40 via the transfer chamber 60 to conduct the fifth step of metal electrode sputtering film-forming (Step 620). The process controller C73 conducts control to execute film-forming treatment of example 3 in the dielectric-electrode sputtering apparatus 40 (Step 621). Then, the transfer controller 70 opens the transfer chamber 60 to atmospheric air using the load-lock apparatus 50 (Step 622).

Figure 19:
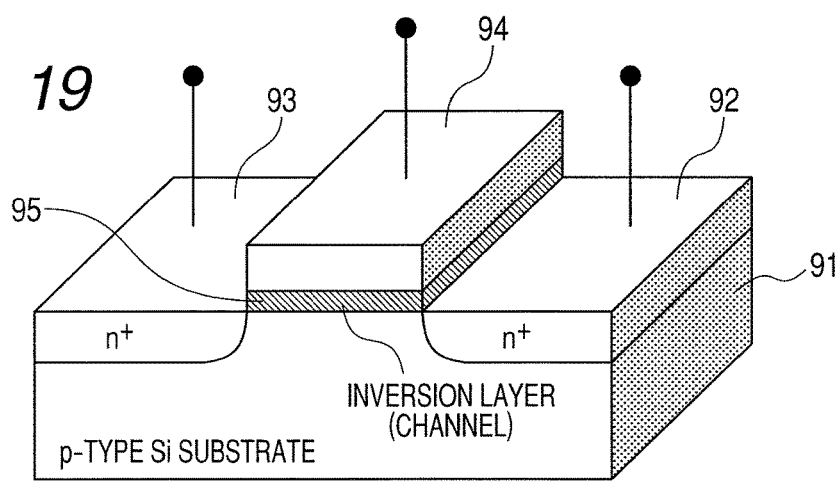
FIG. 19 is a schematic diagram illustrating a MOS-FET manufactured by the treatment of the present invention.

By the above-described treatment of the present invention, the MOS field effect transistor (FET) 90 illustrated in FIG. 19 was manufactured. An HfO film was adopted as a dielectric gate insulation film 95 below a gate electrode 94 between a source region 92 and a drain region 93 of a Si substrate 91. Other than HfO, preferable gate insulation film 95 includes a film of Hf, La, Ta, Al, W, Ti, Si, Ge, or an alloy thereof, and more specifically there are applicable HfN, HfON, HfLaO, HfLaN, HfLaON, HfAlLaO, HfAlLaN, HfAlLaON, LaAlO, LaAlN, LaAlON, LaO, LaN, LaON, HfSiO, and HfSiON. The relative permittivity thereof is in a range from 3.9 to 100, and the fixed charge density is in a range from 0 to $1 \times 10^{11}$ $cm^{-2}$. The film thickness of the gate insulation layer is set to a range from 0.5 to 5.0 nm.

The term "fixed charge" is also referred to as "fixed oxide film charge", meaning the charge existing in $SiO_2$ film and being fixed therein, not migrating in electric field or the like. The fixed oxide film charge appears caused by a structural defect in the oxide film, and depends on the formed state of the oxide film or the heat treatment thereof. Normally there exists a positive fixed charge in the vicinity of Si—$SiO_2$ interface originated from a dangling bond of Si in silicon. The fixed oxide film charge makes the C-V characteristic of MOS structure shift in parallel along the gate voltage axis. The fixed charge density is determined by the C-V method.

As the gate electrode 94 of MOS-FET in FIG. 19, there are applied: metal such as Ti, Al, TiN, TaN, and W; polysilicon (B(boron)-dope: p-Type or P(phosphorus)-dope: n-Type); and Ni-FUSI (fully silicide).

Figure 16:
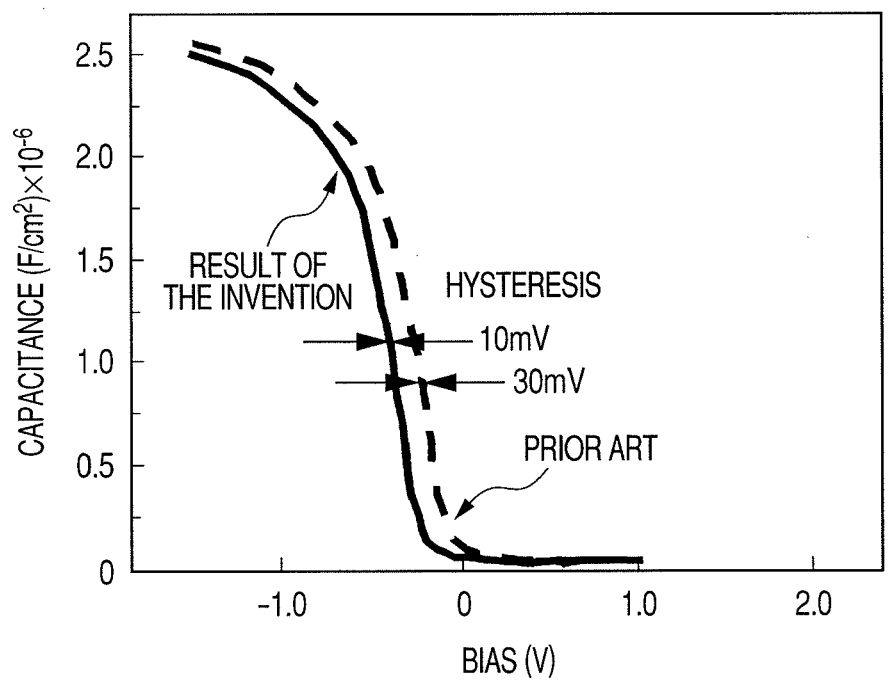
FIG. 16 is a C-V curve obtained by an example of the present invention.

The semiconductor/insulation film joint, which was prepared by the method of the present invention, that is, by the method of treating the surface of a Si substrate having native oxide film formed thereon, growing the Si single crystal film without exposing thereof to atmospheric air, sputtering for forming a dielectric film such as Hf without exposing the substrate to atmospheric air, and oxidizing and nitrifying thereof, gives smaller fixed charge and lower interface state than those of the joint prepared in the atmospheric transfer. Therefore, the joint gives a C-V curve with small hysteresis as shown in FIG. 16, with small leak current, thereby providing good device characteristics. The term "interface state" signifies the energy level of electron being appeared on interface of joint of different kinds of semiconductors and on interface of joint between a semiconductor and a metal or an insulation material. Since the semiconductor face on the interface becomes a condition of breaking bond between atoms, there appears a non-bonding condition called the dangling bond, thus creating an energy level to allow entrapping the charge. Also impurity or defect on the interface creates an energy level allowing entrapping the charge, or an interface state. Generally the interface state shows a long response time and is instable, thus often adversely affects the device characteristics. Lower interface state means better interface. The interface state density is determined by the C-V method.

As illustrated in FIG. 1, the film-forming apparatus of the present invention uses the configuration having each one of: the surface treatment unit 100, the CVD film-forming unit 20, the dielectric-electrode sputtering unit 30, the oxidation-nitrification unit 40, the load-lock chamber 50, and the transfer chamber 60. However, the quantity of each of those units is not necessarily one, and more than one unit for there each can be applied depending on the throughput, the film structure, and the like. For example, to increase the throughput, the load-lock chamber may be substituted by a plurality of load-lock chambers allotting the functions of loading and unloading to each one. Furthermore, for example, the sputtering unit 30 may be substituted by two or more sputtering units allotting the functions of forming the dielectric film and forming the electrode to each one.

However, for effective use of the substrate treatment method which allows conducting the dry substrate surface treatment while keeping flat surface according to the present invention, it is preferable to have at least one unit for each of the surface treatment unit 100, the CVD film-forming unit 20, the load-lock chamber 50, and the transfer chamber 60. With this configuration, the presence of load-lock chamber makes the dry substrate surface treatment possible at high throughput in a stable evacuated atmosphere, and the film-forming by transferring the substrate to the CVD film-forming unit via the transfer chamber in a vacuum without exposing the substrate to atmospheric air allows keeping good condition of interface between the Si substrate surface and the CVD film-formed Si/SiGe layer.

In addition, to effectively use the substrate treatment method which allows treating the dry substrate surface while keeping flat surface according to the present invention, it is preferable to have at least one unit for each of the surface treatment unit 100, the dielectric-electrode sputtering unit 30, the load-lock chamber 50, and the transfer chamber 60. With this configuration, the presence of load-lock chamber makes the dry substrate surface treatment possible at high throughput in a stable evacuated atmosphere, and the film-forming by transferring the substrate to the dielectric-electrode sputtering unit 30 via the transfer chamber in a vacuum without exposing the substrate to atmospheric air allows keeping good condition of interface between the Si substrate surface and the dielectric film or conductive film as the base of the insulation film prepared by sputtering on the Si substrate surface.

Although the example does not give the detail of the CVD film-forming unit 20 in the drawing, any type of epitaxial film-forming unit is applicable if only the unit is provided with a chamber, a substrate-heating mechanism for heating both the substrate holder for holding the substrate and the substrate held thereto, a gas-feed mechanism for supplying a gas containing the raw material gas to conduct the CVD film-formation, and an exhaust means for discharging the chamber atmosphere.

Similarly, the detail of the sputtering unit 30 is not given in the drawing. The sputtering unit 30 may be, however, any type if only the unit has a chamber, a substrate holder for holding the substrate, a mechanism for feeding the gas into the chamber, an exhaust means for discharging the chamber atmosphere, a sputtering cathode for mounting the target made of dielectric or conductive metal, and a high frequency power supply mechanism or a direct current power supply mechanism.

The quantity of the sputtering cathode for mounting the target made of dielectric or conductive metal, (not shown), in the sputtering unit 30 is not necessarily one, and a plurality of sputtering cathodes may be applied for forming a plurality of continuous or discontinuous films and for mounting a plurality of targets thereon. From the point of uniformity of the thickness distribution of the formed film, the substrate holder is preferably provided with a rotary mechanism to rotate the mounted substrate. For allowing film-forming by reactive sputtering, the gas-feed mechanism of the sputtering unit 30 preferably feeds not only inert gas such as Ar but also a reactive gas such as $N_2$ and $O_2$, or a mixture of reactive gas with Ar gas.

What is claimed is:

1. A substrate cleaning method of cleaning an oxide film on the surface of a semiconductor substrate placed in a substrate-cleaning treatment chamber, the method comprising the steps of:
    feeding a plasma-forming gas to a plasma-forming chamber via a plurality of plasma-forming gas feed holes distributedly formed on the face of a plasma-forming gas feed shower plate, the plasma-forming gas feed shower plate being arranged in the plasma-forming chamber and being grounded;
    exciting the plasma-forming gas to generate plasma in the plasma-forming chamber by applying a power from a high-frequency power source to a high-frequency applying electrode having a plurality of electrode through-holes penetrating from the front face to the rear face thereof, each electrode through-hole having a larger diameter than that of a plasma-forming gas feed hole, the high-frequency applying electrode being arranged between a plasma-confinement electrode plate and the plasma-forming gas feed shower plate, the plasma being generated in the plasma-forming chamber including the plurality of electrode through-holes, the plasma-confinement electrode plate partitioning the plasma-forming chamber from the substrate-cleaning treatment chamber and being grounded;
    selectively feeding a radical of the plasma from the plasma-forming chamber to the substrate-cleaning treatment chamber via a plurality of radical feed holes formed distributedly on the face of the plasma-confinement electrode plate;
    feeding a treatment gas which is not excited into the substrate-cleaning treatment chamber via a plurality of treatment gas feed holes distributedly formed on the face of the plasma-confinement electrode plate; and
    conducting cleaning treatment of the oxide film on the surface of the semiconductor substrate by the mixed atmosphere of the radical and the treatment gas, fed into substrate-cleaning the treatment chamber,
    wherein the treatment gas is fed into the substrate-cleaning treatment chamber from the face of the plasma-confinement electrode plate, in almost parallel with the radical feeding, via a plurality of treatment gas feed holes formed next to at least a part of the radical feed holes of the plasma-confinement electrode plate.

2. The substrate cleaning method according to claim 1, wherein the semiconductor substrate is a Si substrate, and the Si substrate is cleaned by etching to remove the oxide film on the Si substrate.

3. A method of forming a gate insulation film in a metal-oxide-semiconductor (MOS) structure comprising the steps of:
    cleaning the surface of a Si substrate by the method of claim 2;
    moving the surface-cleaned Si substrate to an epitaxial chamber without exposing the Si substrate to atmospheric air to form an epitaxial layer on the surface-cleaned Si substrate in the epitaxial chamber;
    moving the Si substrate having the epitaxial layer formed thereon to a sputtering chamber without exposing the Si substrate to atmospheric air to form a dielectric film by sputtering on the epitaxial layer; and
    moving the Si substrate having the dielectric film formed thereon to an oxidation-nitrification chamber without exposing the Si substrate to atmospheric air to form the gate insulation film by oxidizing, nitrifying or oxynitrifying the dielectric film.

4. The method of claim 3, wherein the dielectric film is made of the one selected from the group consisting of Hf, La, Ta, Al, W, Ti, Si and Ge, or an alloy thereof.

5. The substrate cleaning method according to claim 1, wherein the treatment gas is a cleaning gas that cleans the substrate.

6. The substrate cleaning method according to claim 1, wherein each of the plasma-forming gas and the treatment gas is an HF gas.

7. The substrate cleaning method according to claim 1, wherein the plasma-forming gas is fed to the plasma-forming chamber via the plurality of plasma-forming gas feed holes, each plasma-forming gas feed hole having a shape selected from the group consisting of a vertical hole having a constant diameter, a taper-shaped hole having a larger diameter at one surface of the plasma-forming gas feed shower plate as compared to at the other surface of the plasma-forming gas feed shower plate, and a vertical hole having a constant diameter from one surface of the plasma-forming gas feed shower plate to a point within the plasma-forming gas feed shower plate and a larger constant diameter from the point to the other surface of the plasma-forming gas feed shower plate.

8. The substrate cleaning method according to claim 1, wherein the diameter of the plasma-forming gas feed hole is 2 mm or smaller.

9. A method of cleaning a substrate surface in a substrate cleaning apparatus including a plasma-forming chamber, a substrate-cleaning treatment chamber, and a plasma-confinement electrode plate partitioning the plasma-forming chamber from the substrate-cleaning treatment chamber, the method comprising the steps of:
    placing a plate-shape substrate facing the face of the plasma-confinement electrode plate in the substrate-cleaning treatment chamber;
    feeding a radical of plasma generated in the plasma-forming chamber from the plasma-forming chamber to the substrate-cleaning treatment chamber via a plurality of radical feed holes distributedly formed on the face of the plasma-confinement electrode plate for communicating the plasma-forming chamber with the substrate-cleaning treatment chamber; and
    feeding a treatment gas which is not excited into the substrate-cleaning treatment chamber, wherein a plasma-forming gas is fed to the plasma-forming chamber via a plurality of plasma-forming gas feed holes distributedly formed on the face of a plasma-forming gas feed shower plate, the plasma-forming gas feed shower plate being arranged in the plasma-forming chamber, wherein a high-frequency power with a high frequency power density ranging from 0.001 to 0.25 W/cm² is applied to a high-frequency applying electrode in a plate-shape arranged to face the plasma-confinement electrode plate in the plasma-forming chamber and extending in a lateral direction in the plasma-forming chamber, wherein the high-frequency applying electrode has a plurality of through-holes formed penetrating from the front face to the rear face thereof, each through-hole having a larger diameter than that of a plasma-forming gas feed hole and a ratio of V2/V1 is set in a range from 0.01 to 0.8 (where V1 is the total volume of the high-frequency applying electrode including the through-holes, and V2 is the total volume of the through-holes); and wherein the feed of the treatment gas to the substrate-cleaning treatment chamber is done, in parallel with the radical feeding, through a plurality of treatment gas feed holes formed so as to face the face of the substrate, next to at least a part of the radical feed holes of the plasma-confinement electrode plate.

10. The method of cleaning a substrate surface according to claim 9, wherein an oxide film on the substrate surface is cleaned.

11. The method of cleaning a substrate surface according to claim 10, which is a method of cleaning an oxide film on the surface of a group IV semiconductor material substrate, wherein plasma is generated by feeding the plasma-forming gas to the plasma-forming chamber, and each of the plasma-forming gas and the treatment gas contains HF.

12. The method of cleaning a substrate surface according to claim 11, wherein the HF fraction to the total gas flow rate of the plasma-forming gas is in a range from 0.2 to 1.0.

13. The method of cleaning a substrate surface according to claim 12, wherein the treatment gas is only HF.

14. A method of forming a gate insulation film in a metal-oxide-semiconductor (MOS) structure comprising the steps of:

cleaning an oxide film on the surface of a Si substrate by the method of claim 11;

moving the surface-cleaned Si substrate to an epitaxial chamber without exposing the Si substrate to atmospheric air to form an epitaxial layer on the surface-cleaned Si substrate;

moving the Si substrate having the epitaxial layer formed thereon to a sputtering chamber without exposing the Si substrate to atmospheric air to form a dielectric film on the epitaxial layer by sputtering; and moving the Si substrate having the dielectric film formed thereon to an oxidation-nitrification chamber without exposing the Si substrate to atmospheric air to form the gate insulation film by oxidizing, nitrifying or oxynitrifying the dielectric film.

15. The method of forming a gate insulation film according to claim 14, wherein the dielectric film is made of the one selected from the group consisting of Hf, La, Ta, Al, W, Ti, Si and Ge, or an alloy thereof.

16. The method of cleaning a substrate surface according to claim 9, wherein the treatment gas is a cleaning gas that cleans the substrate.

17. The method of cleaning a substrate surface according to claim 9, wherein the gas feed shower plate is connected to a plasma-forming gas supply system.

18. The method of cleaning a substrate surface according to claim 17, wherein each of the plasma-forming gas and the treatment gas is an HF gas.

\* \* \* \* \*